(12) United States Patent
Chang et al.

(10) Patent No.: US 12,419,111 B2
(45) Date of Patent: Sep. 16, 2025

(54) DISPLAY DEVICE

(71) Applicant: HannStar Display Corporation, Taipei (TW)

(72) Inventors: Chung-Lin Chang, Kaohsiung (TW); Hsuan-Chen Liu, Kaohsiung (TW); Yu-Cheng Lin, Pingtung County (TW); Chen-Hao Su, Taichung (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 18/760,026

(22) Filed: Jul. 1, 2024

(65) Prior Publication Data

US 2025/0107234 A1 Mar. 27, 2025

(30) Foreign Application Priority Data

Sep. 21, 2023 (CN) .......................... 202311223138.3

(51) Int. Cl.
*H10D 86/60* (2025.01)
*G09G 3/36* (2006.01)
*H10D 86/40* (2025.01)

(52) U.S. Cl.
CPC ........... *H10D 86/60* (2025.01); *G09G 3/3614* (2013.01); *H10D 86/441* (2025.01); *G09G 2300/0413* (2013.01); *G09G 2300/0426* (2013.01); *G09G 2320/0242* (2013.01)

(58) Field of Classification Search
CPC ............. G02F 1/134336; G02F 1/1339; G02F 1/133388; G02F 2201/50; G09G 2320/046

See application file for complete search history.

(56) References Cited

U.S. PATENT DOCUMENTS

| | | | |
|---|---|---|---|
| 2003/0197826 A1* | 10/2003 | Yun | G09G 3/3614 349/149 |
| 2004/0032557 A1 | 2/2004 | Lee et al. | |
| 2015/0213772 A1* | 7/2015 | Tung | G09G 3/3659 345/694 |
| 2020/0098310 A1* | 3/2020 | Kim | H10K 59/131 |

FOREIGN PATENT DOCUMENTS

TW 201215974 A 4/2012

* cited by examiner

*Primary Examiner* — Shaheda A Abdin
(74) *Attorney, Agent, or Firm* — CKC & Partners Co., LLC

(57) ABSTRACT

A display device has a display area and a peripheral area, and includes an array substrate. The array substrate includes M number of pixel unit columns disposed in the display area and a first dummy electrode disposed in the peripheral area, where M is a positive integer greater than or equal to 2. The M number of pixel unit columns include a first pixel unit column to an $M^{th}$ pixel unit column arranged in sequence. Each of the M number of pixel unit columns includes a plurality of pixel units arranged in sequence. The first dummy electrode is located on one side of the first pixel unit column. During a frame period, the first pixel unit column receives the first pixel signal, and the first dummy electrode receives the first dummy signal. The polarity of the first pixel signal is different from that of the first dummy signal.

10 Claims, 21 Drawing Sheets

DISPLAY DEVICE

RELATED APPLICATIONS

This application claims priority to China Patent Application No. 202311223138.3, filed Sep. 21, 2023, which is herein incorporated by reference in its entirety.

BACKGROUND

Field of Invention

The present disclosure relates to a display device, and more particularly to a display device with dummy electrodes disposed in a peripheral area.

Description of Related Art

Since some materials of the display device are prone to absorb ions, in applying an electric field to drive the liquid crystal, ions may remain on the left and right sides of the display area due to the unidirectional electric field and thus form unnecessary electric fields, resulting in a color shift phenomenon during image display. In most of the conventional designs, the area of the black matrix at the border is increased to shade some pixels that are on the left and right sides of the display area and may lead to color shift. However, such designs will decrease the aperture ratio and cannot effectively reduce the phenomenon of color shift. Therefore, how to mitigate the phenomenon of residual ions to effectively avoid color shift is one of the goals to be achieved in this technical field.

SUMMARY

The objective of the present disclosure is to provide a display device which can at least mitigate the phenomenon of residual ions and thereby effectively avoid color shift.

The present disclosure provides a display device which has a display area and a peripheral area and includes an array substrate. The array substrate includes a substrate, M number of pixel unit columns and a first dummy electrode. The M number of pixel unit columns are disposed on the substrate and located in the display area, M is a positive integer greater than or equal to 2. The M number of pixel unit columns include a first pixel unit column to an $M^{th}$ pixel unit column arranged in sequence in a first direction. Each of the M number pixel unit columns includes a plurality of pixel units arranged in sequence in a second direction, where the second direction is different from the first direction. Each of the pixel units includes a pixel electrode. The pixel electrode includes a plurality of strip parts and at least one slit, and each slit is located between two adjacent strip parts of the strip parts. The first dummy electrode is disposed on the substrate and located in the peripheral area, where the first dummy electrode is located on a side of the first pixel unit column. During a frame period, the first pixel unit column receives the first pixel signal, and the first dummy electrode receives the first dummy signal, where the polarity of the first pixel signal is different from the polarity of the first dummy signal.

In some embodiments, a driving mode of the display device is column inversion driving or dot inversion driving.

In some embodiments, the array substrate further includes M number of data lines. The M number of data lines include a first data line to an $M^{th}$ data line respectively electrically connected to the first pixel unit column to the $M^{th}$ pixel unit column. The first dummy electrode is electrically connected to an $i^{th}$ data line among the first data line to the $M^{th}$ data line, where i is an even number greater than 1 and less than or equal to M.

In some embodiments, the array substrate further includes another first dummy electrode disposed on the substrate and located in the peripheral area. The another first dummy electrode is located on a side of the $M^{th}$ pixel unit column. During the frame period, the $M^{th}$ pixel unit column receives a $M^{th}$ pixel signal, the another first dummy electrode receives another first dummy signal, and the polarity of the $M^{th}$ pixel signal is different from the polarity of the another first dummy signal.

In some embodiments, a driving mode of the display device is column inversion driving or dot inversion driving, and the array substrate further includes M number of data lines, the M number of data lines includes a first data line to an $M^{th}$ data line respectively electrically connected to the first pixel unit column to the $M^{th}$ pixel unit column. The another first dummy electrode is electrically connected to an $(M-j)^{th}$ data line among the first data line to the $M^{th}$ data line, where j is an odd number greater than or equal to 1 and less than M.

In some embodiments, the array substrate further includes a second dummy electrode disposed on the substrate and located in the peripheral area. The second dummy electrode is located on a side of the first dummy electrode, where the first dummy electrode is between the second dummy electrode and the first pixel unit column. During the frame period, the second dummy electrode receives a second dummy signal, and the polarity of the second dummy signal is different from the polarity of the first dummy signal.

In some embodiments, a driving mode of the display device is column inversion driving or dot inversion driving, and the array substrate further includes M number of data lines, the M number of data lines includes a first data line to an $M^{th}$ data line respectively electrically connected to the first pixel unit column to the $M^{th}$ pixel unit column. The second dummy electrode is electrically connected to a $p^{th}$ data line among the first data line to the $M^{th}$ data line, where p is an odd number greater than or equal to 1 and less than or equal to M.

In some embodiments, the array substrate further includes another second dummy electrode disposed on the substrate and located in the peripheral area. The another second dummy electrode is located on a side of the another first dummy electrode, the another first dummy electrode is between the another second dummy electrode and the $M^{th}$ pixel unit column. During the frame period, the another second dummy electrode receives another second dummy signal, and a polarity of the another second dummy signal is different from a polarity of the another first dummy signal.

In some embodiments, a driving mode of the display device is column inversion driving or dot inversion driving, and the array substrate further includes M number of data lines, the M number of data lines includes a first data line to an $M^{th}$ data line respectively electrically connected to the first pixel unit column to the $M^{th}$ pixel unit column. The another second dummy electrode is electrically connected to an $(M-q)^{th}$ data line among the first data line to the $M^{th}$ data line, where q is 0 or an even number greater than 1 and less than M.

In some embodiments, the display device further includes M number of data lines and a driving circuit. The M number of data lines include a first data line to an $M^{th}$ data line respectively electrically connected to the first pixel unit column to the $M^{th}$ pixel unit column. The driving circuit includes M number of data pads and at least one dummy pad, the M number of data pads are respectively electrically connected to the first data line to the $M^{th}$ data line, the at least one dummy pad includes a first dummy pad electrically connected to the first dummy electrode. During the frame period, the driving circuit transmits the first pixel signal to the first pixel unit column, and the driving circuit transmits the first dummy signal to the first dummy electrode.

In some embodiments, each of the pixel units includes a common electrode located between the pixel electrode and the substrate in a direction perpendicular to the substrate.

In some embodiments, the first pixel unit column includes N number of pixel units, where N is a positive integer greater than or equal to 2. The N number of pixel units include a first pixel unit to an $N^{th}$ pixel unit, and the first dummy electrode includes N number of strip electrodes. The N number of strip electrodes include a first strip electrode to an $N^{th}$ strip electrode electrically connected to each other, where the first strip electrode to the $N^{th}$ strip electrode are respectively adjacent to the first pixel unit to the $N^{th}$ pixel unit.

In some embodiments, the first strip electrode to the $N^{th}$ strip electrode and the pixel electrode of the first pixel unit to the pixel electrode of the $N^{th}$ pixel unit are the same transparent conductive layer.

In some embodiments, shapes of the first strip electrode to the $N^{th}$ strip electrode are the same as shapes of the strip parts of the pixel electrodes of the first pixel unit to the $N^{th}$ pixel unit in a top view.

In some embodiments, the array substrate includes dummy electrodes, and the dummy electrodes include K number of dummy electrodes located on the side of the first pixel unit column. K is a positive integer greater than or equal to 2 and less than or equal to a number of the strip parts of the pixel electrode of one of the pixel units. The K number of dummy electrodes comprise the first dummy electrode to an $K^{th}$ dummy electrode, and the first dummy electrode to the $K^{th}$ dummy electrode are sequentially arranged in a direction opposite to the first direction. During the frame period, polarities of any two adjacent dummy electrodes among the first dummy electrode to the $K^{th}$ dummy electrode are opposite to each other.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
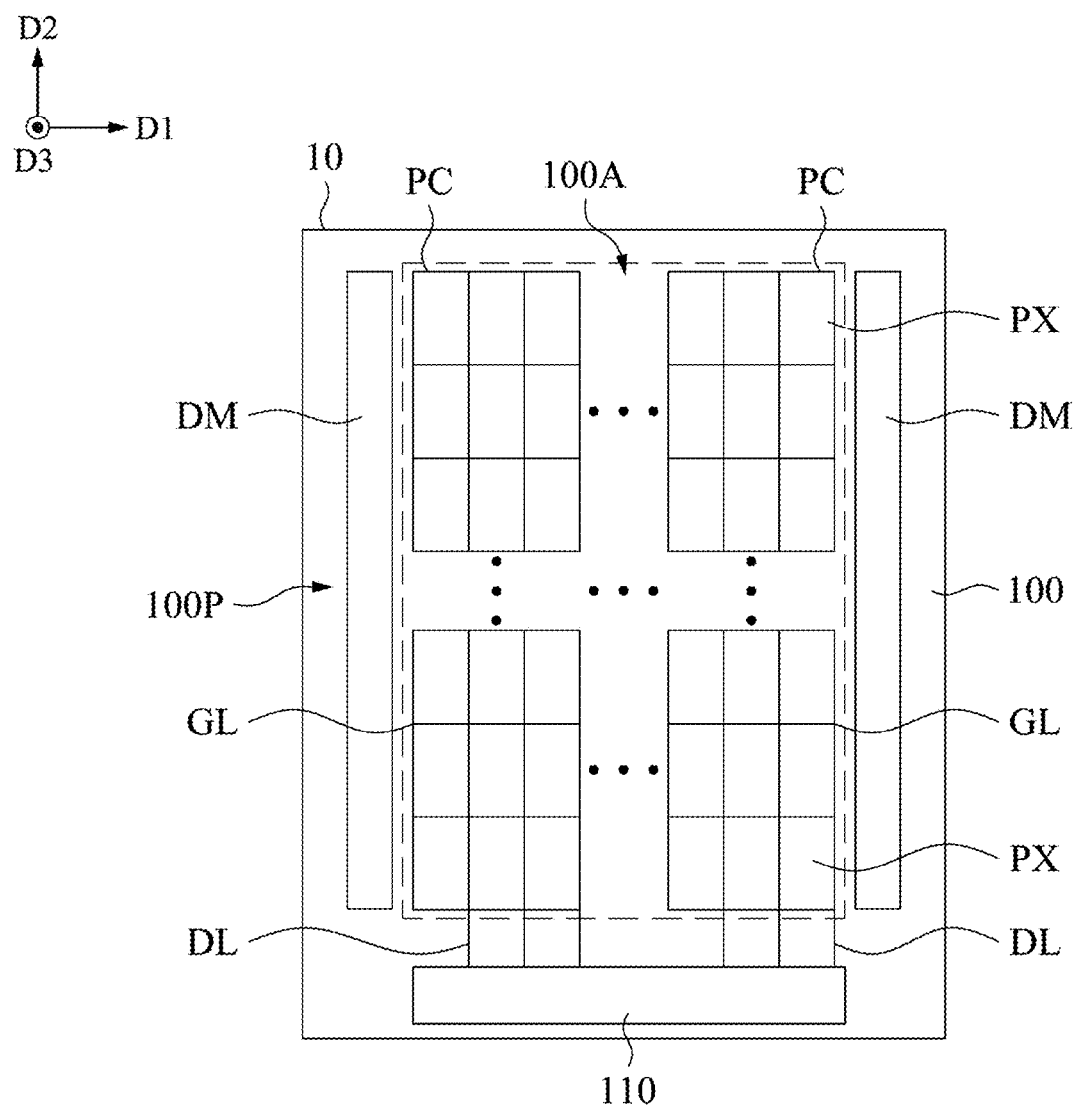
FIG. 1 is a schematic view of a display device according to at least one embodiment of the present disclosure.

The embodiments of the present disclosure are discussed in detail below. It will be appreciated, however, that the embodiments provide many applicable concepts which may be implemented in a wide variety of specific contexts. The discussed and disclosed embodiments are for illustrative purposes only and are not intended to limit the scope of the present disclosure.

In the following description, in order to clearly present the technical features of the present disclosure, the dimensions (such as length, width, thickness, and depth) of elements (such as layers, films, substrates, and areas) in the drawings will be enlarged in unequal proportions, and the number of some elements will be reduced. Therefore, the description and explanation of the following embodiments are not limited to the numbers, the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of the present disclosure.

The spatial relative terms used in the present disclosure, such as "below," "under," "above," "on," and the like, are intended to facilitate the recitation of a relative relationship between one element or feature and another as depicted in the figures. The true meaning of these spatial relative terms includes other orientations. For example, the relationship between one element and another may change from "below" and "under" to "above" and "on" when the figure is turned 180 degrees up or down. In addition, spatially relative descriptions used in the present disclosure should be interpreted in the same manner.

It should be understood that while the present disclosure may use terms such as "first", "second", "third", etc. to describe various elements or features, these elements or features should not be limited by these terms. These terms are primarily used to distinguish one element from another, or one feature from another. In addition, the term "or" as used in the present disclosure may include, as appropriate, any one or a combination of the listed items in association.

Moreover, the present disclosure may be implemented or applied in various other specific embodiments, and the details of the present disclosure may be combined, modified, and altered in various embodiments based on different viewpoints and applications, without departing from the idea of the present disclosure.

FIG. 1 is a schematic view of a display device 1 according to at least one embodiment of the present disclosure. The display device 1 has a display area 100A and a peripheral area 100P, and includes an array substrate 10. The array substrate 10 includes a substrate 100, pixel unit columns PC, and a dummy electrode group DM. As shown in FIG. 1, the pixel unit columns PC are disposed on the substrate 100 and located in the display area 100A, and sequentially arranged in a first direction D1. Each of the pixel unit columns PC includes pixel units PX sequentially arranged in a second direction D2, where the second direction D2 is different from the first direction D1. In some embodiments, the first direction D1 and the second direction D2 are perpendicular to each other, but are not limited thereto. The dummy electrode group DM is disposed on the substrate 100 and located in the peripheral area 100P, and adjacent to the pixel unit columns PC located at the outermost side of the display area 100A (as shown in FIG. 1, the pixel unit column PC located at the leftmost side and the pixel unit column PC located at the rightmost side).

Referring to FIG. 1, the array substrate 10 further includes scan lines GL and data lines DL. The scan lines GL are extended in the first direction D1 and sequentially arranged in the second direction D2. The data lines DL are extended in the second direction D2 and sequentially arranged in the first direction D1. The array substrate 10 further includes thin-film transistors (not shown). The thin film transistors are electrically connected to the scan lines GL and the data lines DL, respectively, to serve as switching elements for the pixel units PX. The electrical connection relationship between the thin film transistors, the corresponding scan lines GL and the corresponding data lines DL can refer to FIG. 3. The display device 1 further includes a driving circuit 110. The driving circuit 110 is electrically connected to the data lines DL, and transmits pixel signals to the pixel units PX of the pixel unit columns PC respectively via the data lines DL during a frame period. In some embodiments, the driving circuit 110 may be disposed in at least one chip, but is not limited thereto. In FIG. 1, the driving circuit 110 is disposed on the substrate 100, but is not limited thereto. In other embodiments, the driving circuit 110 may be disposed on a circuit board and the circuit board is electrically connected to pads disposed on the substrate 100. In some embodiments, the display device 1 further includes a gate driver (not shown) electrically connected to the scan lines GL and transmitting gate driving signals to the scan lines GL respectively. In some embodiments, the display device 1 further includes a counter substrate (not shown) disposed opposite to the array substrate 10, and a liquid crystal layer disposed between the array substrate 10 and the counter substrate, where the counter substrate may be a color filter substrate, but is not limited thereto.

Figure 2:
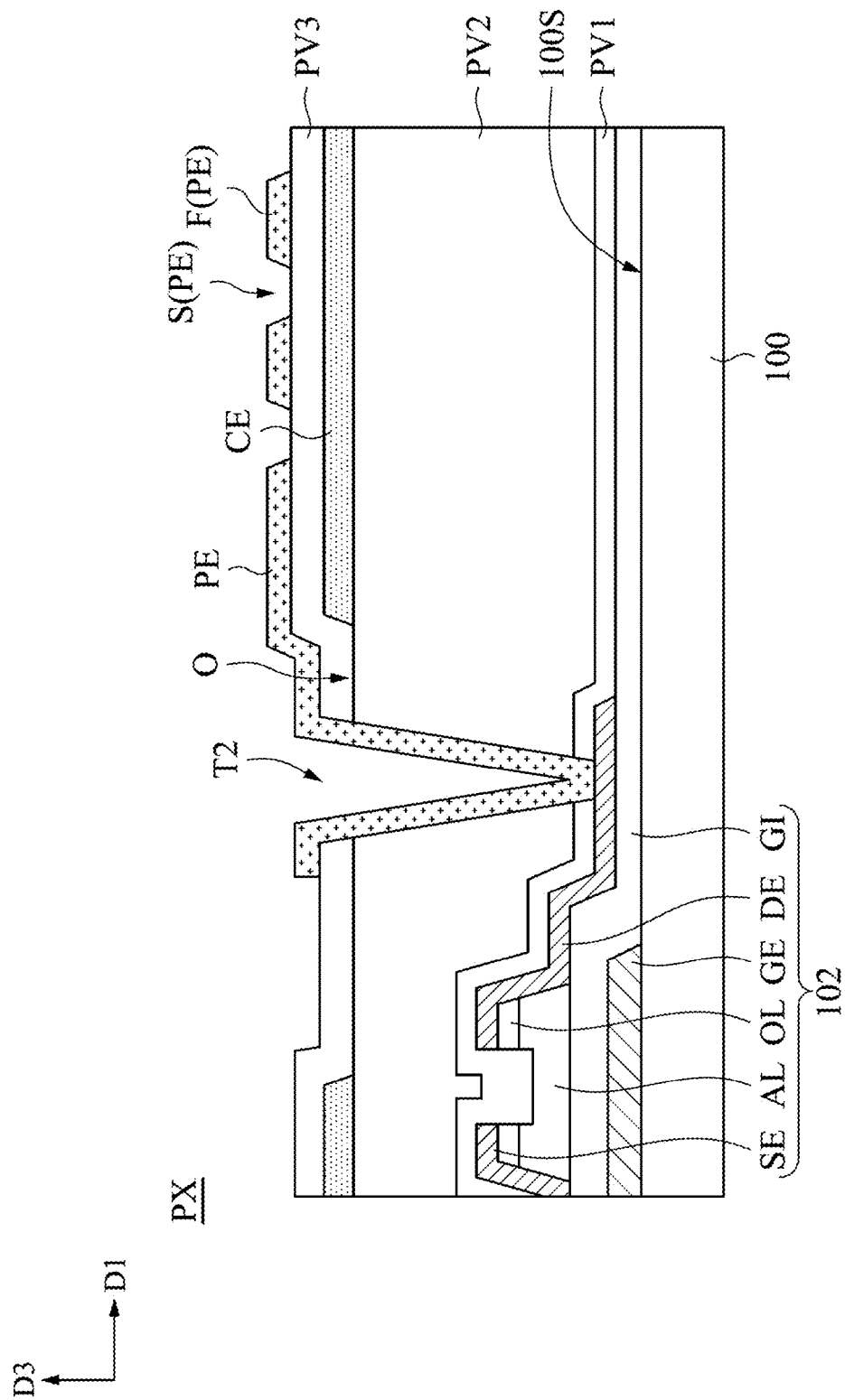
FIG. 2 is a partially schematic cross-sectional view of a pixel unit according to at least one embodiment of the present disclosure.

FIG. 2 is a partially schematic cross-sectional view of a pixel unit PX according to at least one embodiment of the present disclosure. As shown in FIG. 2, the pixel unit PX includes a thin film transistor 102, a pixel electrode PE, and a common electrode CE. The pixel electrode PE includes strip parts F and at least one slit S, where each of the slits S is disposed between two adjacent strip parts F. The pixel electrode PE is electrically connected to the thin film transistor 102, and the common electrode CE is located between the pixel electrode PE and the substrate 100 in a direction perpendicular to the surface 100S of the substrate 100. That is, in a third direction D3 perpendicular to the first direction D1 and the second direction D2, the common electrode CE is located between the pixel electrode PE and the substrate 100. Other elements of the pixel unit PX in FIG. 2 can refer to the description of FIG. 9A. In some embodiments, the display device 1 may be a touch display device. The array substrate 10 includes touch electrodes, and each of the touch electrodes includes the common electrodes CE of the pixel units PX. During a display period, the common electrodes CE has a common voltage to form an electric field with the pixel electrodes PE to control the direction of the liquid crystal molecules of the liquid crystal layer, and during a touch sensing period, the common electrodes CE of the pixel units PX serve as the touch electrode to sense a user's touch position.

The structure of the dummy electrode group DM of FIG. 1 and the manner in which the dummy electrode group DM receives the corresponding dummy signals will be further described in the first to fifth embodiments.

Figure 3:
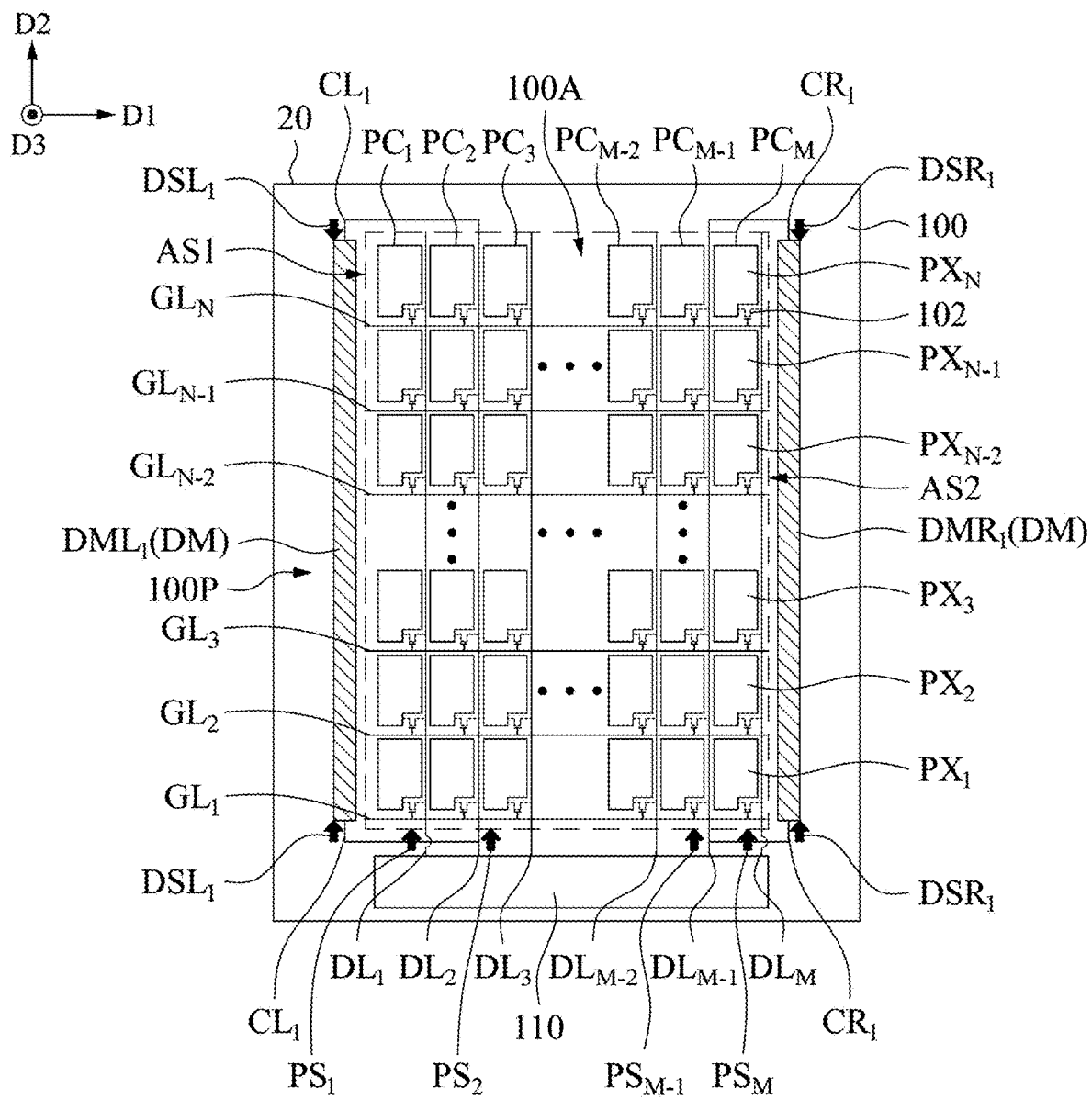
FIG. 3 is a schematic view of a display device according to a first embodiment of the present disclosure.

FIG. 3 is a schematic view of a display device 2 according to a first embodiment of the present disclosure. The structures and relative positions of most elements of the embodiment of FIG. 3 are the same as those of the embodiment of FIG. 1, so the same features are not repeated here. Referring to FIG. 3, the display device 2 includes an array substrate 20. The array substrate 20 includes M number of pixel unit columns $PC_1$-$PC_M$, which are disposed on the substrate 100 and located in the display area 100A. M is a positive integer greater than or equal to 2. It should be noted that in FIG. 3 and subsequent FIGS. 10, 17, 18, and 20, the arrows drawn next to the data lines and the arrows next to the connection lines electrically connected the dummy electrodes represent the pixel signals transmitted to the data lines and the dummy signals transmitted to the dummy electrodes, respectively. For example, in FIG. 3, the arrow drawn next to the first connection line $CL_1$ electrically connected the first dummy electrode $DML_1$ represents the first dummy signal $DSL_1$ transmitted to the first dummy electrode $DML_1$, the arrow drawn next to the first data line $DL_1$ represents the first pixel signal $PS_1$ transmitted to the first data line $DL_1$, and the rest is not repeated.

As shown in FIG. 3, the M number of pixel unit columns $PC_1$-$PC_M$ include a first pixel unit column $PC_1$ to an $M^{th}$ pixel unit column $PC_M$. The first pixel unit column $PC_1$ to the $M^{th}$ pixel unit column $PC_M$ are sequentially arranged in the first direction D1. Each of the pixel unit columns $PC_1$-$PC_M$ includes N number of pixel units $PX_1$-$PX_N$, where N is a positive integer greater than or equal to 2. The N number of pixel units $PX_1$-$PX_N$ include a first pixel unit $PX_1$ to an $N^{th}$ pixel unit to $PX_N$, and the first pixel unit $PX_1$ to the $N^{th}$ pixel unit $PX_N$ of each pixel unit column $PC_1$-$PC_M$ are sequentially arranged in the second direction D2. The display area 100A has a first side AS1 and a second side AS2 that are opposite to each other. The first pixel unit column $PC_1$ and the $M^{th}$ pixel unit column $PC_M$ are the pixel unit columns closest to the first side AS1 and the second side AS2 respectively. The dummy electrode group DM includes first dummy electrodes $DML_1$, $DMR_1$, which are disposed on the substrate 100 and located in the peripheral area 100P. The first dummy electrode $DML_1$ is adjacent to the first pixel unit column $PC_1$, and the first dummy electrode $DMR_1$ is adjacent to the $M^{th}$ pixel unit column $PC_M$. In this embodiment, the first dummy electrode $DML_1$ is located on one side of the first pixel unit column $PC_1$ (i.e., the side of the first pixel unit column $PC_1$ opposite to the second pixel unit column $PC_2$), and the first dummy electrode $DMR_1$ is located on one side of the $M^{th}$ pixel unit column $PC_M$ (i.e., the side of the $M^{th}$ pixel unit column $PC_M$ opposite to the $(M-1)^{th}$ pixel unit column $PC_{M-1}$). Therefore, the first pixel unit column $PC_1$ is located between the first dummy electrode $DML_1$ and the second pixel unit column $PC_2$ in the first direction D1, and the $M^{th}$ pixel unit column $PC_M$ is located between the $(M-1)^{th}$ pixel unit column $PC_{M-1}$ and the first dummy electrode $DMR_1$ in the first direction D1.

Referring to FIG. 3, the array substrate 20 further includes N number of scan lines $GL_1$-$GL_N$ and M number of data lines $DL_1$-$DL_M$. The N number of scan lines $GL_1$-$GL_N$ include the first scan line $GL_1$ to the $N^{th}$ scan line $GL_N$ sequentially arranged in the second direction D2, and the M number of data lines $DL_1$-$DL_M$ include the first data line $DL_1$ to the $M^{th}$ data line $DL_M$ sequentially arranged in the first direction D1. The first data line $DL_1$ to the $M^{th}$ data line $DL_M$ are electrically connected to the first pixel unit column $PC_1$ to the $M^{th}$ pixel unit column $PC_M$ respectively, so as to transmit the first pixel signal $PS_1$ to the $M^{th}$ pixel signal $PS_M$ to the first pixel unit column $PC_1$ to the $M^{th}$ pixel unit column $PC_M$ respectively. In addition, the first dummy signal $DSL_1$ is transmitted to the first dummy electrode $DML_1$, and the first dummy signal $DSR_1$ is transmitted to the first dummy electrode $DMR_1$.

Figure 6:
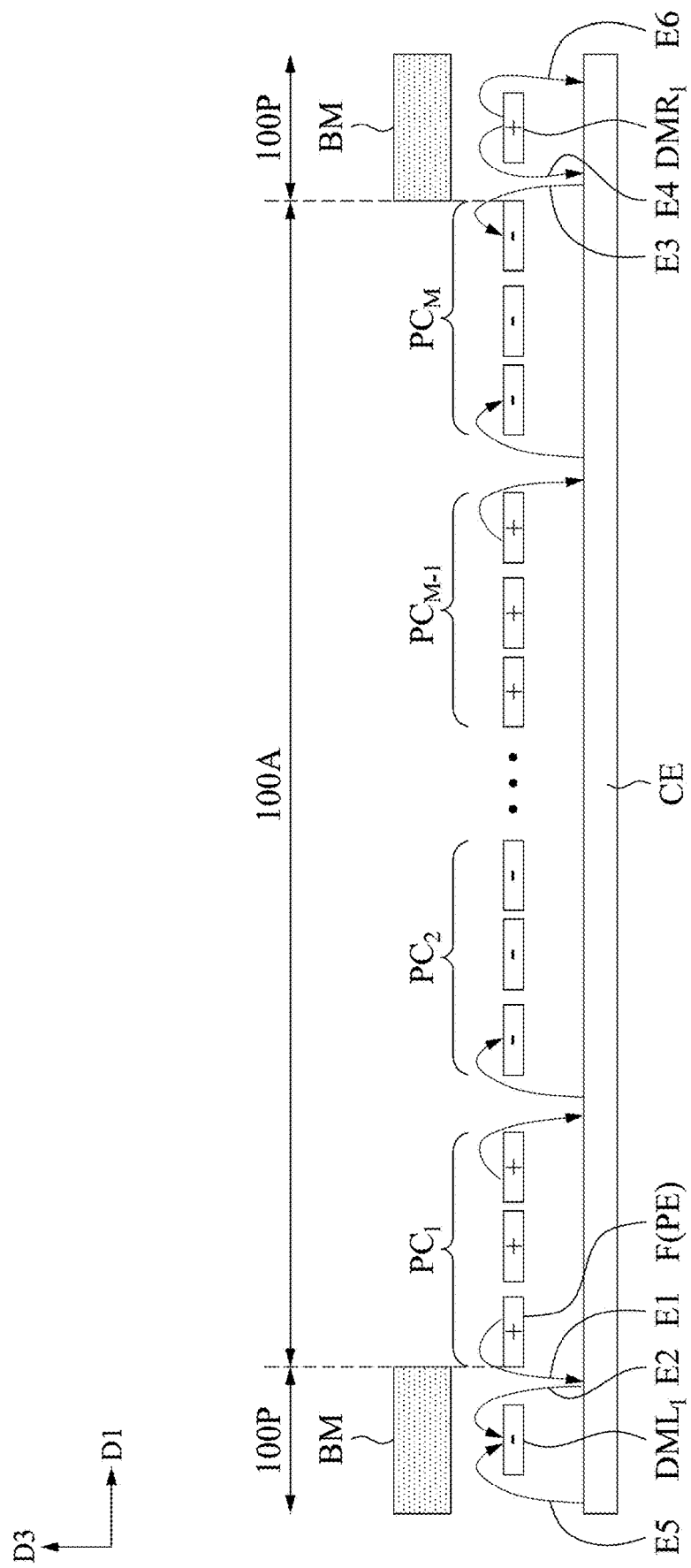
FIG. 6 is a schematic diagram of the electric field distribution of a display device according to the first embodiment of the present disclosure.

In this embodiment, in order to prevent ions from accumulating at the edges of the first pixel unit column $PC_1$ and the $M^{th}$ pixel unit column $PC_M$, the polarity of the first dummy electrode $DML_1$ is opposite to the polarity of the pixel unit PX of the first pixel unit column $PC_1$, and the polarity of the first dummy electrode $DMR_1$ is opposite to the polarity of the pixel unit PX of the $M^{th}$ pixel unit column $PC_M$ (the detailed reasons can refer to the description of FIG. 6). Specifically, the polarity of the first dummy electrode $DML_1$ is opposite to the polarity of the pixel electrode PE of the pixel unit PX of the first pixel unit column $PC_1$, and the polarity of the first dummy electrode $DMR_1$ is opposite to the polarity of the pixel electrode PE of the pixel unit PX of the $M^{th}$ pixel unit column $PC_M$. Therefore, in this embodiment, the driving mode of the display device 2 can be column inversion driving or dot inversion driving. The first dummy electrode $DML_1$ is electrically connected to the corresponding data line to receive a pixel signal with a polarity opposite to the first pixel signal $PS_1$, so that the polarity of the first dummy electrode $DML_1$ is opposite to the polarity of the pixel unit PX of the first pixel unit column $PC_1$. The first dummy electrode $DMR_1$ is electrically connected to the corresponding data line to receive a pixel signal with a polarity opposite to the $M^{th}$ pixel signal $PS_M$, so that the polarity of the first dummy electrode $DMR_1$ is opposite to the polarity of the pixel unit PX of the $M^{th}$ pixel unit column $PC_M$.

In this embodiment, the array substrate 20 further includes a first connection line $CL_1$, and the first dummy electrode $DML_1$ is electrically connected to an $i^{th}$ data line among the first data line $DL_1$ to the $M^{th}$ data line $DL_M$ through the first connection line $CL_1$, where i is an even number greater than 1 and less than or equal to M. As shown in FIG. 3, the first dummy electrode $DML_1$ is electrically connected to the second data line $DL_2$ through the first connection line $CL_1$, but is not limited thereto. In other embodiments, the first dummy electrode $DML_1$ may be electrically connected to one of the fourth data line $DL_4$, the sixth data line $DL_6$, the eighth data line $DL_8$, and so on, through the first connection line $CL_1$.

During a frame period, the first pixel unit column $PC_1$ receives the first pixel signal $PS_1$ through the first data line $DL_1$, the second pixel unit column $PC_2$ receives the second pixel signal $PS_2$ through the second data line $DL_2$, and the first dummy electrode $DML_1$ is electrically connected to the second data line $DL_2$ through the first connection line $CL_1$ to receive the second pixel signal $PS_2$ as the first dummy signal $DSL_1$ (i.e., the first dummy signal $DSL_1$ is the same as the second pixel signal $PS_2$). The driving mode of the display device 2 of this embodiment can be column inversion driving or dot inversion driving, that is, when the polarity of the first pixel signal $PS_1$ is positive, the polarity of the second pixel signal $PS_2$ and the polarity of the first dummy signal $DSL_1$ are negative, or when the polarity of the first pixel signal $PS_1$ is negative, the polarity of the second pixel signal $PS_2$ and the polarity of the first dummy signal $DSL_1$ are positive. Therefore, during a frame period, the polarity of the first pixel signal $PS_1$ and the polarity of the first dummy signal $DSL_1$ are opposite to each other, that is, the polarity of the first pixel unit column $PC_1$ and the polarity of the first dummy electrode $DML_1$ adjacent to the first pixel unit column $PC_1$ are opposite to each other.

Referring to FIG. 3, the array substrate 20 further includes a first connection line $CR_1$. The first dummy electrode $DMR_1$ is electrically connected to an $(M-j)^{th}$ data line among the first data line $DL_1$ to the $M^{th}$ data line $DL_M$ through the first connection line $CR_1$, where j is an odd number greater than or equal to 1 and less than M. As shown in FIG. 3, the first dummy electrode $DMR_1$ is electrically connected to the $(M-1)^{th}$ data line $DL_{M-1}$ through the first connection line $CR_1$, but is not limited thereto. In other embodiments, the first dummy electrode $DMR_1$ may be electrically connected to one of the $(M-3)^{th}$ data line $DL_{M-3}$, the $(M-5)^{th}$ data line $DL_{M-5}$, the $(M-7)^{th}$ data line $DL_{M-7}$, and so on, through the first connection line $CR_1$.

During a frame period, the $M^{th}$ pixel unit column $PC_M$ receives the $M^{th}$ pixel signal $PS_M$ through the $M^{th}$ data line $DL_M$, the $(M-1)^{th}$ pixel unit column $PC_{M-1}$ receives the $(M-1)^{th}$ pixel signal $PS_{M-1}$ through the $(M-1)^{th}$ data line $DL_{M-1}$, and the first dummy electrode $DMR_1$ is electrically connected to the $(M-1)^{th}$ data line $DL_{M-1}$ through the first connection line $CR_1$ to receive the $(M-1)^{th}$ pixel signal $PS_{M-1}$ as the first dummy signal $DSR_1$ (i.e., the first dummy signal $DSR_1$ is the same as the $(M-1)^{th}$ pixel signal $PS_{M-1}$). The driving mode of the display device 2 of this embodiment can be column inversion driving or dot inversion driving, that is, when the polarity of the $M^{th}$ pixel signal $PS_M$ is positive, the polarity of the $(M-1)^{th}$ pixel signal $PS_{M-1}$ and the polarity of the first dummy signal $DSR_1$ are negative, or when the polarity of the $M^{th}$ pixel signal $PS_M$ is negative, the polarity of the $(M-1)^{th}$ pixel signal $PS_{M-1}$ and the polarity of the first dummy signal $DSR_1$ are positive. Therefore, during a frame period, the polarity of the $M^{th}$ pixel signal $PS_M$ and the polarity of the first dummy signal $DSR_1$ are opposite to each other, that is, the polarity of the $M^{th}$ pixel unit column $PC_M$ and the polarity of the first dummy electrode $DMR_1$ adjacent to the $M^{th}$ pixel unit column $PC_M$ are opposite to each other.

Figure 4A:
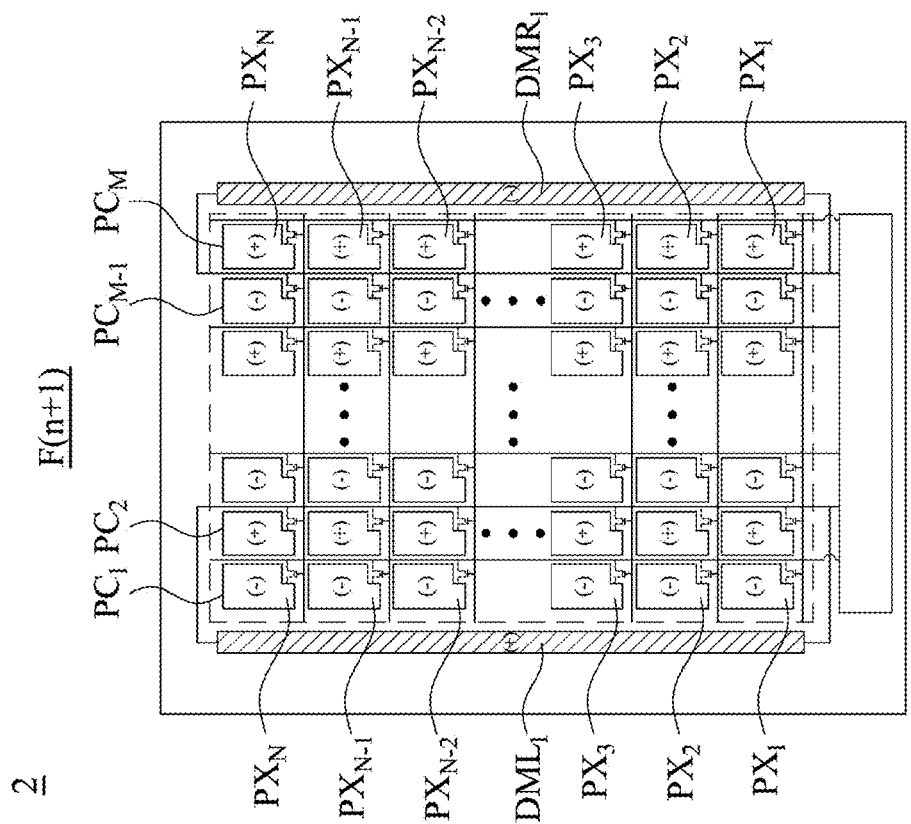
FIGS. 4A and 4B are respectively schematic diagrams of polarity configurations of pixel unit columns and dummy electrodes during two adjacent frame periods of a display device according to the first embodiment of the present disclosure.
Figure 4B:
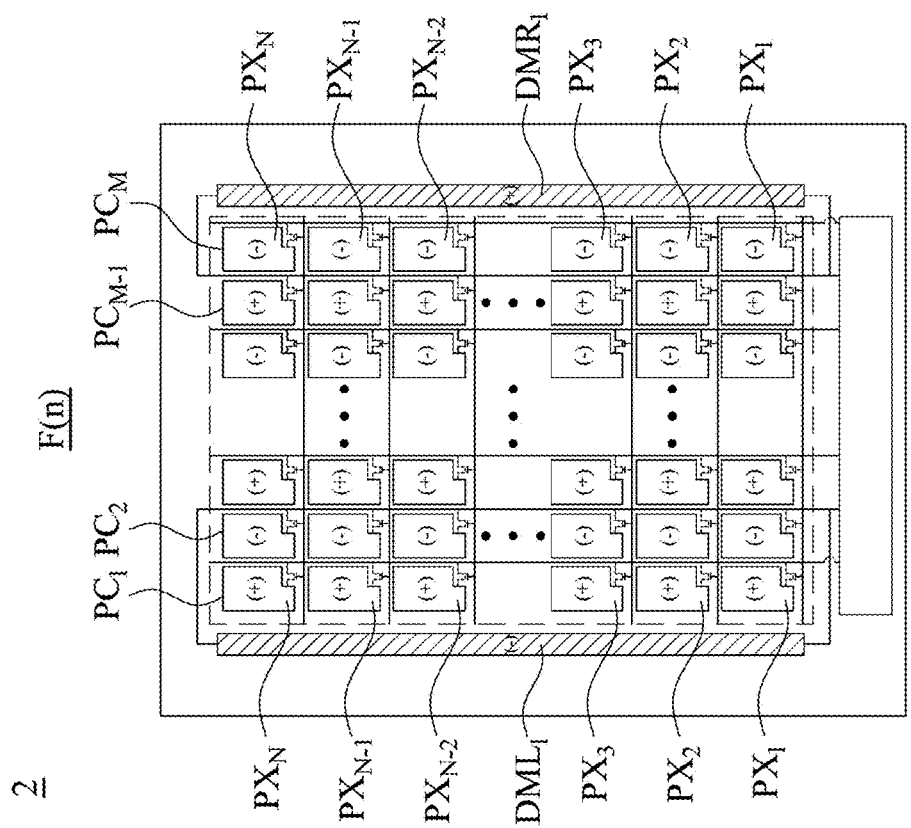
Figure 5:
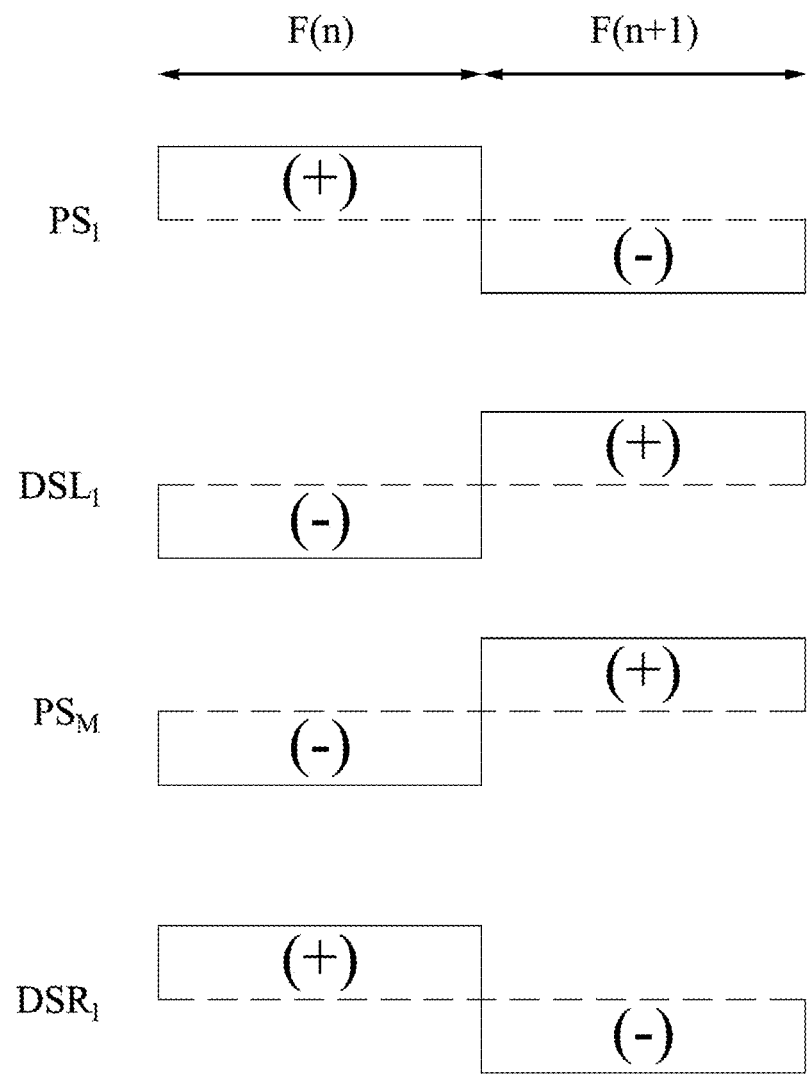
FIG. 5 is a schematic diagram of the polarity of pixel signals and dummy signals during two adjacent frame periods of a display device according to the first embodiment of the present disclosure.

FIGS. 4A and 4B are respectively schematic diagrams of polarity configurations of pixel unit columns and dummy electrodes during two adjacent frame periods of the display device 2 according to the first embodiment of the present disclosure, where the driving mode of the display device 2 is column inversion driving. FIG. 4A shows the polarity configuration relationship of the first unit column $PC_1$ to the $M^{th}$ pixel unit column $PC_M$ and the first dummy electrodes $DML_1$, $DMR_1$ of the display device 2 in a frame period F(n). FIG. 4B shows the polarity configuration relationship of the first unit column $PC_1$ to the $M^{th}$ pixel unit column $PC_M$ and the first dummy electrodes $DML_1$, $DMR_1$ of the display device 2 in the next frame period F(n+1). FIG. 5 is a schematic diagram of the polarity of the first pixel signal $PS_1$, the first dummy signal $DSL_1$, the $M^{th}$ pixel signal $PS_M$ and the first dummy signal $DSR_1$ during two adjacent frame periods of the display device 2 according to the first embodiment of the present disclosure. FIG. 6 is a schematic diagram of the electric field distribution between the first dummy electrodes $DML_1$, $DMR_1$ and common electrode CE, and the electric field distribution between the pixel electrode PE and the common electrode CE of the display device 2 of FIG. 4A. (+) and (−) in FIG. 4A, FIG. 4B, FIG. 5 and FIG. 6 represent positive polarity and negative polarity respectively. For ease of explanation, FIG. 6 only shows the common electrode CE, the first dummy electrodes $DML_1$, $DMR_1$ disposed on the common electrode CE, the pixel electrodes PE of the first pixel unit column $PC_1$ to the $M^{th}$ pixel unit column $PC_M$, and the light shielding layer BM corresponding to the peripheral area 100P. The light shielding layer BM may be, for example, a black matrix layer, but is not limited thereto. In addition, in FIG. 4A, FIG. 4B, FIG. 5 and FIG. 6, M is an even number (i.e., the number of pixel unit columns PC of the display device 2 is an even number) as an example, but is not limited to this. In other embodiments, M may be an odd number.

Referring to FIG. 3, FIG. 4A, FIG. 5, and FIG. 6, during the frame period F(n), the polarity of the first pixel signal $PS_1$, the polarity of the second pixel signal $PS_2$ (i.e., the first dummy signal $DSL_1$), the polarity of the $(M-1)^{th}$ pixel signal $PS_{M-1}$ (i.e., the first dummy signal $DSR_1$) and the polarity of the $M^{th}$ pixel signal $PS_M$ are positive, negative, positive, negative respectively. Therefore, the first dummy electrode $DML_1$ is with negative polarity, the first pixel unit $PX_1$ to the $N^{th}$ pixel unit $PX_N$ of the first pixel unit column $PC_1$ are all with positive polarity, the first pixel unit $PX_1$ to the $N^{th}$ pixel unit $PX_N$ of the second pixel unit column $PC_2$ are all with negative polarity, the first pixel unit $PX_1$ to the $N^{th}$ pixel unit $PX_N$ of the $(M-1)^{th}$ pixel unit column $PC_{M-1}$ are all with positive polarity, the first pixel unit $PX_1$ to the $N^{th}$ pixel unit $PX_N$ of the $M^{th}$ pixel unit column $PC_M$ are all with negative polarity, and the first dummy electrode $DMR_1$ is with positive polarity. That is, the polarity of the first dummy electrode $DML_1$, the polarity of the first pixel unit column $PC_1$ to the polarity of the $M^{th}$ pixel unit column $PC_M$, and the polarity of the first dummy electrode $DMR_1$ are arranged in the order of negative, positive, negative, positive, and so on (i.e., are arranged in a negative-positive alternating manner).

As shown in FIG. 6, the voltage of the common electrode CE is between the positive polarity voltage and the negative polarity voltage. For example, the positive polarity voltage, the voltage of the common electrode CE and the negative polarity voltage may be 5 volts, 0 volts and −5 volts respectively, but are not limited thereto. As shown in FIG. 4A and FIG. 6, during the frame period F(n), the polarity (i.e., negative polarity) of the first dummy electrode $DML_1$ is opposite to the polarity (i.e., positive polarity) of the first pixel unit $PX_1$ to the $N^{th}$ pixel unit $PX_N$ of the first pixel unit column $PC_1$, so the electric field E1 between the pixel electrodes PE of the pixel units PX of the first pixel unit column $PC_1$ and the common electrode CE is opposite to the electric field E2 between the first dummy electrode $DML_1$ and the common electrode CE, thereby preventing the accumulation of ions at the edges of the pixel units PX of the first pixel unit column $PC_1$ that may affect the display quality of the display device 2. Similarly, the polarity (i.e., positive polarity) of the first dummy electrode $DMR_1$ is opposite to the polarity (i.e., negative polarity) of the first pixel unit $PX_1$ to the $N^{th}$ pixel unit $PX_N$ of the $M^{th}$ pixel unit column $PC_M$, so the electric field E3 between the pixel electrodes PE of the pixel units PX of the $M^{th}$ pixel unit column $PC_M$ and the common electrode CE is opposite to the electric field E4 between the first dummy electrode $DMR_1$ and the common electrode CE, thereby preventing the accumulation of ions at the edges of the pixel units PX of the $M^{th}$ pixel unit column $PC_M$ that may affect the display quality of the display device 2. Specifically, by disposing dummy electrodes with opposite polarities next to the pixel unit columns (such as the first pixel unit column $PC_1$ and the $M^{th}$ pixel unit column $PC_M$) located at the edge of the display area 100A, it is possible to avoid color shift at the edges of the display area 100A due to accumulation of ions caused by the electric field between the pixel electrodes PE of the pixel units PX in the pixel unit column and the common electrode CE. It should be noted that although the electric field E5 between the first dummy electrode $DML_1$ and the common electrode CE and the electric field E6 between the first dummy electrode $DMR_1$ and the common electrode CE in FIG. 5 do not have corresponding opposite electric fields, ions may accumulate in the left side of the first dummy electrode $DML_1$ and the right side of the first dummy electrode $DMR_1$, but the first dummy electrodes $DML_1$, $DMR_1$ are located in the peripheral area 100P, and the light shielding layer BM overlaps the first dummy electrodes $DML_1$, $DMR_1$ in the third direction D3. Therefore the display quality of the display device 2 is not affected.

As shown in FIG. 3, FIG. 4B, and FIG. 5, during the next frame period F(n+1), the polarity of the first pixel signal $PS_1$, the polarity of the second pixel signal $PS_2$ (i.e., the first dummy signal $DSL_1$), the polarity of the $(M-1)^{th}$ pixel signal $PS_{M-1}$ (i.e., the first dummy signal $DSR_1$) and the polarity of the $M^{th}$ pixel signal $PS_M$ are negative, positive, negative, positive respectively. Therefore, the first dummy electrode $DML_1$ is with positive polarity, the first pixel unit $PX_1$ to the $N^{th}$ pixel unit $PX_N$ of the first pixel unit column $PC_1$ are all with negative polarity, the first pixel unit $PX_1$ to the $N^{th}$ pixel unit $PX_N$ of the second pixel unit column $PC_2$ are all with positive polarity, and the first pixel unit $PX_1$ to the $N^{th}$ pixel unit $PX_N$ of the $(M-1)^{th}$ pixel unit column $PC_{M-1}$ are all with negative polarity, the first pixel unit $PX_1$ to the $N^{th}$ pixel unit $PX_N$ of the $M^{th}$ pixel unit column $PC_M$ are all with positive polarity, and the first dummy electrode $DMR_1$ is with negative polarity. That is, the polarity of the first dummy electrode $DML_1$, the polarity of the first pixel unit column $PC_1$ to the polarity of the $M^{th}$ pixel unit column $PC_M$, and the polarity of the first dummy electrode $DMR_1$ are arranged in the order of positive, negative, positive, negative, and so on (i.e., are arranged in a positive-negative alternating manner). The electric field distribution diagram corresponding to FIG. 4B can be obtained by reversing the polarity of the pixel electrodes PE of each pixel unit column and the first dummy electrodes $DML_1$, $DMR_1$ in FIG. 6 and reversing the directions of the electric fields E1-E6. Similarly, during the next frame period F(n+1), the polarity (i.e., positive polarity) of the first dummy electrode $DML_1$ is opposite to the polarity (i.e., negative polarity) of the first pixel unit $PX_1$ to the $N^{th}$ pixel unit $PX_N$ of the first pixel unit column $PC_1$, so the electric field E1 is opposite to the electric field E2. The polarity (i.e., negative polarity) of the first dummy electrode $DMR_1$ is opposite to the polarity (i.e., positive polarity) of the first pixel unit $PX_1$ to the $N^{th}$ pixel unit $PX_N$ of the $M^{th}$ pixel unit column $PC_M$, so the electric field E3 is opposite to the electric field E4, thereby preventing the accumulation of ions at the edges of the pixel units PX of the first pixel unit column $PC_1$ and the edges of the pixel units PX of the $M^{th}$ pixel unit column $PC_M$ that may affect the display quality of the display device 2.

In FIG. 4A, FIG. 4B and FIG. 5, the driving mode of the display device 2 is column inversion driving, but is not limited thereto. In other embodiments, the driving mode of the display device 2 can be dot inversion driving, which can also avoid the accumulation of ions at the edges of the pixel units PX of the first pixel unit column $PC_1$ and the edges of the pixel units PX of the $M^{th}$ pixel unit column $PC_M$ that may affect the display quality of the display device 2.

Figure 7:
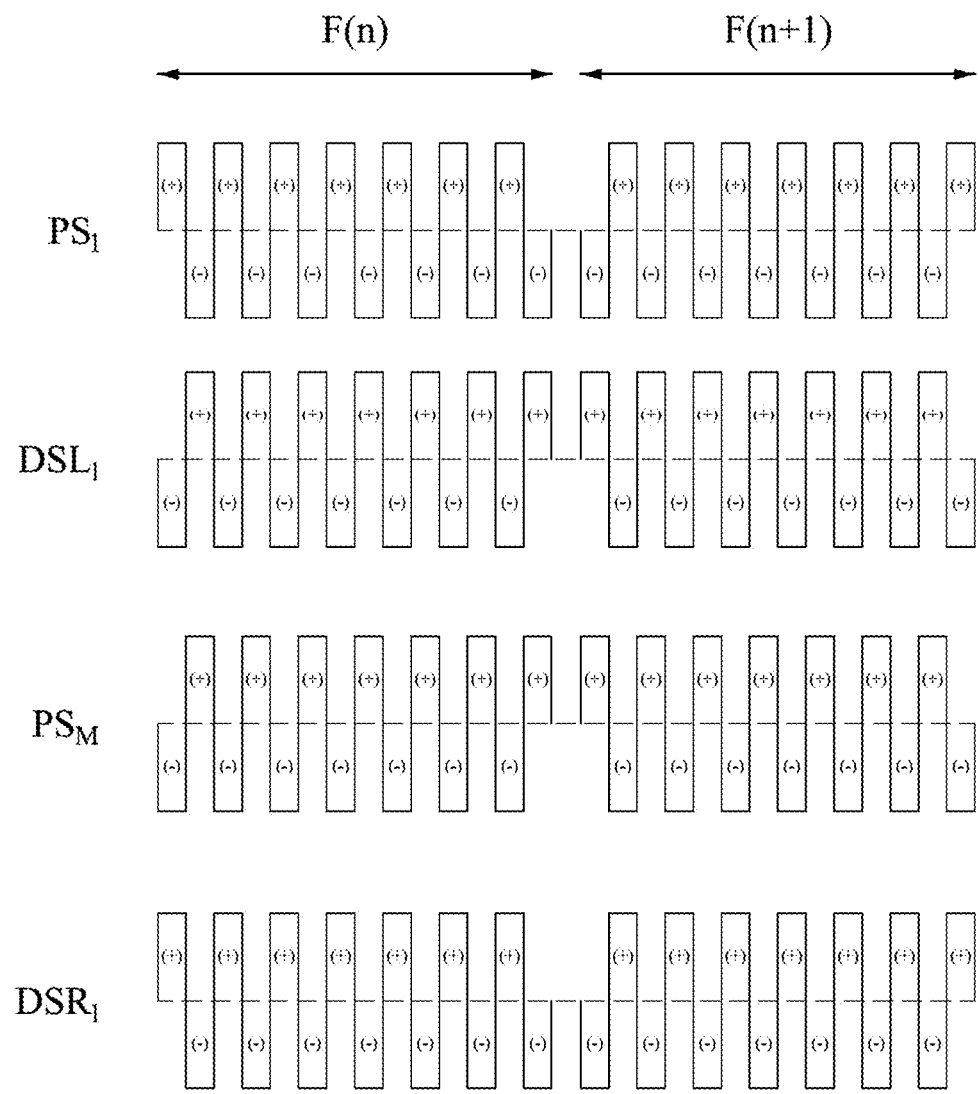
FIG. 7 is another schematic diagram of the polarity of pixel signals and dummy signals during two adjacent frame periods of a display device according to the first embodiment of the present disclosure.

FIG. 7 is another schematic diagram of the polarity of the first pixel signal $PS_1$, the first dummy signal $DSL_1$, the $M^{th}$ pixel signal $PS_M$ and the first dummy signal $DSR_1$ during two adjacent frame periods of the display device 2 according to the first embodiment of the present disclosure, where the driving mode of the display device 2 is dot inversion driving. As shown in FIG. 3 and FIG. 7, in each frame period F(n), F(n+1), each of the first pixel signal $PS_1$, the second pixel signal $PS_2$ (i.e., the first dummy signal $DSL_1$), the $(M-1)^{th}$ pixel signal $PS_{M-1}$ (i.e., the first dummy signal $DSR_1$) and the $M^{th}$ pixel signal $PS_M$ has multiple switches of positive polarity and negative polarity. When the first pixel signal $PS_1$ is one of positive polarity and negative polarity, the first dummy signal $DSL_1$ is the other one of positive polarity and negative polarity, and when the $M^{th}$ pixel signal $PS_M$ is one of positive polarity and negative polarity, the first dummy signal $DSR_1$ is the other one of positive polarity and negative polarity, so the electric field between the pixel electrodes PE of the pixel units PX of the first pixel unit column $PC_1$ and the common electrode CE is opposite to the electric field between the first dummy electrode $DML_1$ and the common electrode CE, and the electric field between the pixel electrodes PE of the pixel units PX of the $M^{th}$ pixel unit column $PC_M$ and the common electrode CE is opposite to the electric field between the first dummy electrode $DMR_1$ and the common electrode CE in a frame period. As a result, the color shift phenomenon at the edges of the display area 100A due to the accumulation of ions caused by the electric field between the pixel units PX of the pixel unit columns located at the edge of the display area 100A (e.g., the first pixel unit column $PC_1$ and the $M^{th}$ pixel unit column $PC_M$) and the common electrode CE can be avoided.

Figure 8:
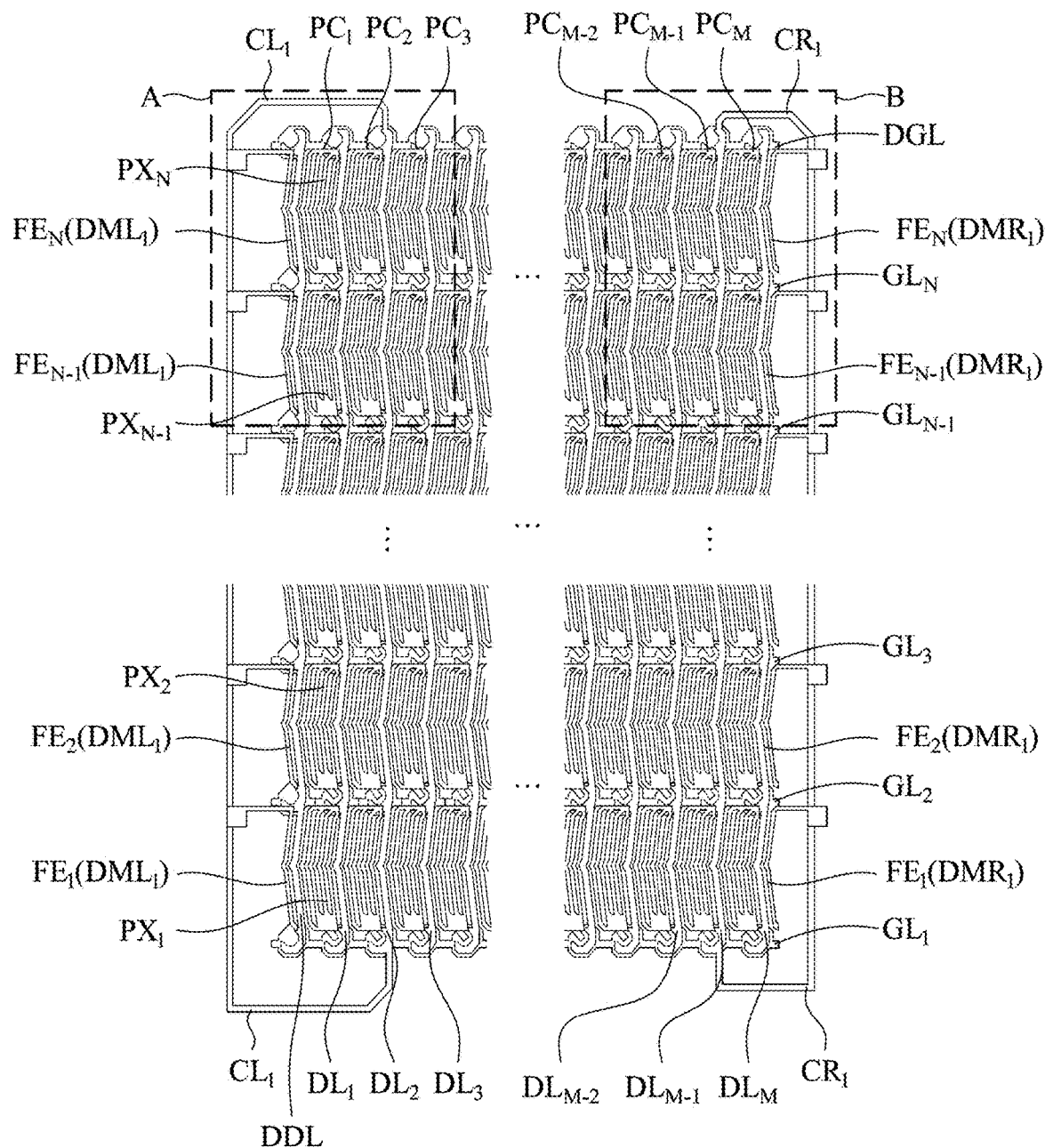
FIG. 8 is a simplified layout diagram of a display device according to the first embodiment of the present disclosure.
Figure 9B:
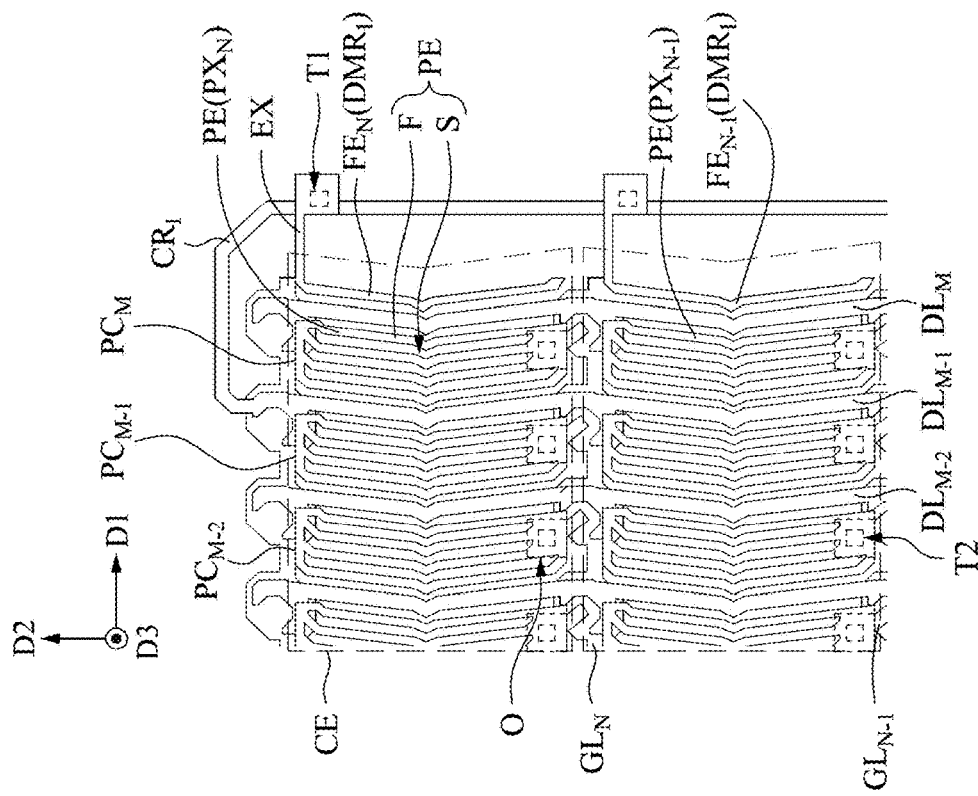
FIGS. 9A and 9B are respectively enlarged views of different regions in FIG. 8.
Figure 9A:
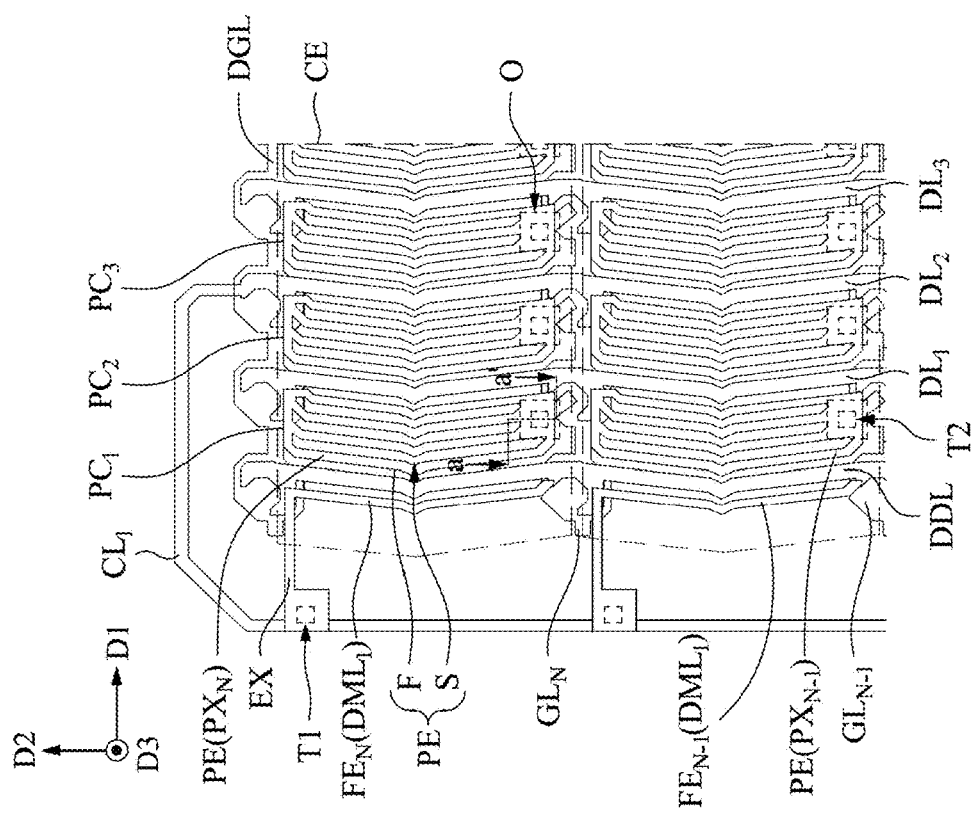

FIG. 8 is a simplified layout diagram of a display device 2 according to the first embodiment of the present disclosure. FIGS. 9A and 9B are respectively enlarged views of the regions A, B in FIG. 8. For the sake of simplicity, FIG. 8 omits the drawing of the common electrode CE, and the description of the common electrode CE can be found in FIG. 9A and FIG. 9B. Referring to FIG. 3, FIG. 8, FIG. 9A, and FIG. 9B, it is noted that in FIG. 8, FIG. 9A, and FIG. 9B, for ease of layout and symmetry of patterns, the display device 2 further includes a dummy data line DDL, and a dummy scan line DGL, which are not electrically connected to the pixel unit PX located in the display area 100A. In some embodiments, the display device may not include dummy data lines DDL and dummy scan lines DGL. As shown in FIG. 8, each of the first dummy electrodes $DML_1$, $DMR_1$ includes N number of strip electrodes $FE_1$-$FE_N$. The N number of strip electrodes $FE_1$-$FE_N$ include a first strip electrode $FE_1$ to an $N^{th}$ strip electrode $FE_N$ electrically connected to each other. The first strip electrode $FE_1$ to the $N^{th}$ strip electrode $FE_N$ of the first dummy electrode $DML_1$ are respectively adjacent to the first pixel unit $PX_1$ to the $N^{th}$ pixel unit $PX_N$ of the first pixel unit column $PC_1$, and the first strip electrode $FE_1$ to the $N^{th}$ strip electrode $FE_N$ of the first dummy electrode $DMR_1$ are respectively adjacent to the first pixel unit $PX_1$ to the $N^{th}$ pixel unit $PX_N$ of the $M^{th}$ pixel unit column $PC_M$. In this embodiment, the first strip electrode $FE_1$ to the $N^{th}$ strip electrode $FE_N$ may be the same film layer as the pixel electrodes PE of the first pixel unit $PX_1$ to the $N^{th}$ pixel unit $PX_N$ (for example, a transparent conductive layer may include the first strip electrode FE to the $N^{th}$ strip electrode $FE_N$ and the pixel electrodes PE of the first pixel unit $PX_1$ to the $N^{th}$ pixel unit $PX_N$), and/or the shapes of the first strip electrode $FE_1$ to the $N^{th}$ strip electrode $FE_N$ in the top view (i.e., the shapes of the first strip electrode $FE_1$ to the $N^{th}$ strip electrode $FE_N$ seen from the third direction D3) may be the same as the shapes of the strip parts F of the pixel electrodes PE of the first pixel unit $PX_1$ to the $N^{th}$ pixel unit $PX_N$ in the top view, but are not limited thereto.

As shown in FIGS. 9A and 9B, each of the first dummy electrodes $DML_1$, $DMR_1$ further includes an extension part EX electrically connected the first connection lines $CL_1$, $CR_1$ respectively. Specifically, as shown in FIG. 9A, the strip electrode $FE_N$ of the first dummy electrode $DML_1$ is electrically connected to the first connection line $CL_1$ through the extension part EX and the first through hole T1, and as shown in FIG. 9B, the strip electrode $FE_N$ of the first dummy electrode $DMR_1$ is electrically connected to the first connection line $CR_1$ through another extension part EX and another first through hole T1.

Referring to FIG. 2, FIG. 9A and FIG. 9B, where FIG. 2 is a schematic cross-sectional view corresponding to the line a-a' in FIG. 9A. The pixel electrode PE is electrically connected to the drain electrode DE of the corresponding thin film transistor 102 through a second through hole T2. In addition, as shown in FIG. 9A and FIG. 9B, the common electrode CE includes openings O corresponding to the second through holes T2 (i.e., in the top view direction, the second through hole T2 overlap the opening O, and the projection of the second through hole T2 on the substrate 100 is located in the projection of the opening O on the substrate 100).

As shown in FIG. 2, in the thin film transistor 102, the gate electrode GE is disposed on the substrate 100, the gate insulating layer GI is disposed on the gate electrode GE, the active layer AL is disposed on the gate insulating layer GI, the source electrode SE and the drain electrode DE are disposed on the active layer AL, the ohmic contact layer OL is disposed between the active layer AL and the source electrode SE and between the active layer AL and the electrode drain DE, the first insulating layer PV1 is disposed on the source electrode SE and the drain electrode DE, the second insulating layer PV2 is disposed on the first insulating layer PV1, the common electrode CE is disposed on the second insulating layer PV2, the third insulating layer PV3 is disposed on the common electrode CE, and the pixel electrode PE is disposed on the third insulating layer PV3 and electrically connected to the drain electrode DE through the second through hole T2 of the first insulating layer PV1, the second insulating layer PV2 and the third insulating layer PV3.

In addition, the common electrode CE includes the opening O corresponding to the second through hole T2, so that the pixel electrode PE is electrically connected to the drain electrode DE. In this embodiment, the second insulating layer PV2 can be used as a flat layer, but is not limited thereto. In some embodiments, there is no need to dispose the second insulating layer PV2, that is, the common electrode CE can be directly dispose d on the first insulating layer PV1.

In some embodiments, the materials of the common electrode CE, the pixel electrode PE, and the strip electrodes $FE_1$-$FE_N$ of the first dummy electrodes $DML_1$, $DMR_1$ may include transparent conductive materials. For example, the transparent conductive materials may include metal oxide materials, such as indium tin oxide (ITO) or indium zinc oxide (IZO), but is not limited thereto. In some embodiments, the pixel electrode PE and each of the strip electrodes $FE_1$-$FE_N$ are the same transparent conductive layer, that is, the pixel electrode PE and the strip electrodes $FE_1$-$FE_N$ are made of the same material and formed by the same process.

Referring to FIG. 6 as well. In the embodiment where the pixel electrode PE and the strip electrodes $FE_1$-$FE_N$ of the first dummy electrodes $DML_1$ and $DMR_1$ are the same transparent conductive layer, the first dummy electrode $DML_1$ is adjacent to the pixel electrode PE of each of the pixel units PX of the first pixel unit column $PC_1$ (i.e., the first strip electrode $FE_1$ to the $N^{th}$ strip electrode $FE_N$ of the first dummy electrode $DML_1$ are respectively adjacent to the pixel electrode PE of the first pixel unit $PX_1$ to the pixel electrodes PE of the $N^{th}$ pixel unit $PX_N$ of the first pixel unit column $PC_1$), and the first dummy electrode $DMR_1$ is adjacent to the pixel electrode PE of each of the pixel units PX of the $M^{th}$ pixel unit column $PC_M$ (i.e., the first strip electrode $FE_1$ to the $N^{th}$ strip electrode $FE_N$ of the first dummy electrode $DMR_1$ are respectively adjacent to the pixel electrode PE of the first pixel unit $PX_1$ to the pixel electrodes PE of the $N^{th}$ pixel unit $PX_N$ of the $M^{th}$ pixel unit column $PC_M$), the distance between the first dummy electrode $DML_1$ and the common electrode CE in the third direction D3 is substantially the same as the distance between the pixel electrode PE of each of the pixel units PX of the first pixel unit column $PC_1$ and the common electrode CE in the third direction D3, and the electric field E1 and the electric field E2 are adjacent to each other, therefore, the region located on the side of the first pixel unit column $PC_1$ opposite to the second pixel unit column $PC_2$ is affected by the electric field E1 and the electric field E2 with approximately the same intensity and opposite directions, thereby avoiding the accumulation of ions at the edges of the pixel units PX of the first pixel unit column $PC_1$ that may affect the display quality of the display device 2. Moreover, the distance between the first dummy electrode $DMR_1$ and the common electrode CE in the third direction D3 is substantially the same as the distance between the pixel electrode PE of each of the pixel units PX of the $M^{th}$ pixel unit column $PC_M$ and the common electrode CE in the third direction D3, and the electric field E3 and the electric field E4 are adjacent to each other, therefore, the region located on the side of the $M^{th}$ pixel unit column $PC_M$ opposite to the $(M-1)^{th}$ pixel unit column $PC_{M-1}$ is affected by the electric field E3 and the electric field E4 with approximately the same intensity and opposite directions, thereby avoiding the accumulation of ions at the edges of the pixel units PX of the $M^{th}$ pixel unit column $PC_M$ that may affect the display quality of the display device 2.

In some embodiments, the substrate 100 may be a transparent substrate or a non-transparent substrate, and the material of the substrate 100 may include quartz, glass, polymer materials or other appropriate materials. In some embodiments, a deposition process, an inkjet process, a printing process, a coating process, a photolithography etching process, and/or other appropriate processes may be used to form the thin film transistor 102, the scan lines $GL_1$-$GL_N$, and the data lines $DL_1$-$DL_M$, the first insulating layer PV1, the second insulating layer PV2, the common electrode CE, the third insulating layer PV3, the pixel electrodes PE, the strip electrodes $FE_1$-$FE_N$ of the first dummy electrodes $DML_1$, $DMR_1$ and the first connection lines $CL_1$, $CR_1$ on the substrate 100.

In some embodiments, the active layer AL may include silicon semiconductor materials (e.g., polycrystalline silicon, amorphous silicon, etc.), oxide semiconductor materials, or organic semiconductor materials, and the ohmic contact layer OL may include semiconductor materials including N-type dopants. The gate electrodes GE, the source electrodes SE, the drain electrodes DE, the scan lines $GL_1$-$GL_N$, the data lines $DL_1$-$DL_M$, and the first connection lines $CL_1$, $CR_1$ may include metals with good electrical conductivity, such as aluminum, molybdenum, titanium, copper, and other metals. In some embodiments, the source electrodes SE, the drain electrodes DE, the data lines $DL_1$-$DL_M$, and the first connection lines $CL_1$, $CR_1$ are the same metal layer (for example, a metal layer may include the source electrodes SE, the drain electrodes DE, the data lines $DL_1$-$DL_M$, and the first connection lines $CL_1$, $CR_1$). That is, the data lines $DL_1$-$DL_M$ and the first connection lines $CL_1$, $CR_1$ are made of the same material and formed by the same process. In the embodiment where the pixel electrodes PE and the strip electrodes $FE_1$-$FE_N$ of the first dummy electrodes $DML_1$, $DMR_1$ are the same transparent conductive layer, and where the first connection lines $CL_1$, $CR_1$, the source electrodes SE, the drain electrodes DE, and the data lines $DL_1$-$DL_M$ are the same metal layer, the first through holes T1 may be through holes penetrating through the first insulating layer PV1, the second insulating layer PV2, and the third insulating layer PV3, such that the first dummy electrodes $DML_1$, $DMR_1$ may be electrically connected to the first connection lines $CL_1$, $CR_1$ through the through holes T1 respectively, but are limited thereto.

In some embodiments, the gate insulating layer GI, the first insulating layer PV1, the second insulating layer PV2, and the third insulating layer PV3 may be a single-layer structure or a multi-layer stacked structure, and the materials thereof may, for example, include inorganic insulating materials, organic insulating materials, or a combination thereof, where the inorganic insulating materials may be, for example, silicon oxide, silicon nitride, silicon nitride, etc., and the organic insulating materials may be, for example, acrylic, silicone, siloxane, polyimide, epoxy, etc.

Figure 10:
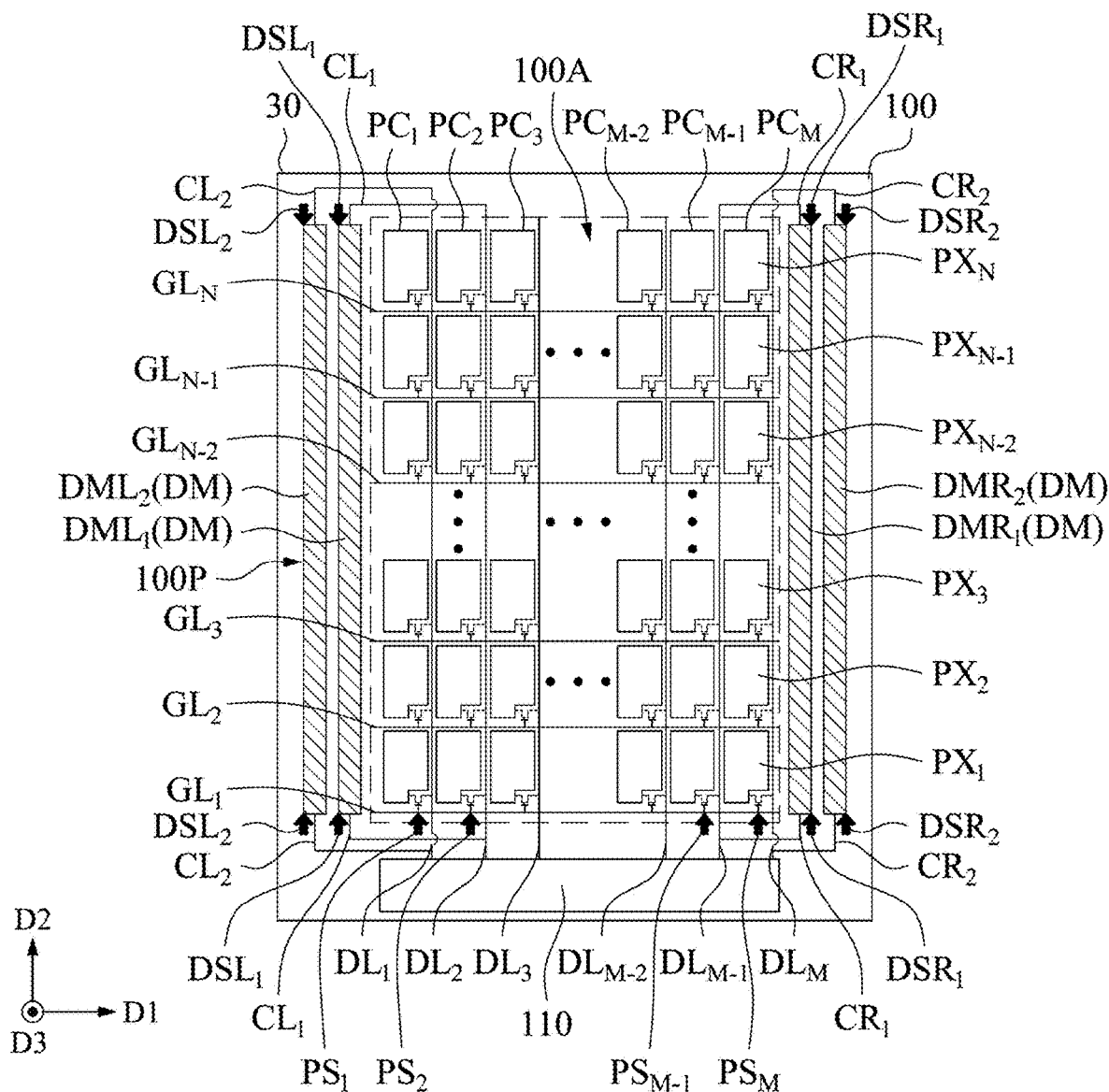
FIG. 10 is a schematic view of a display device according to a second embodiment of the present disclosure.

FIG. 10 is a schematic view of a display device 3 according to a second embodiment of the present disclosure. The structures, the materials, the manufacturing processes and the relative positions of most elements of the display devices 2, 3 are the same, so the same features are not repeated here. As shown in FIG. 10, compared with the first embodiment, the dummy electrode group DM of the display device 3 further includes second dummy electrodes $DML_2$, $DMR_2$, which are disposed on the substrate 100 and located in the peripheral area 100P. The second dummy electrode $DML_2$ is adjacent to the first dummy electrode $DML_1$, and the first dummy electrode $DML_1$ is located between the second dummy electrode $DML_2$ and the first pixel unit column $PC_1$ in the first direction D1. The second dummy electrode $DMR_2$ is adjacent to the first dummy electrode $DMR_1$, and the first dummy electrode $DMR_1$ is located between the second dummy electrode $DMR_2$ and the $M^{th}$ pixel unit column $PC_M$ in the first direction D1. The second dummy signal $DSL_2$ is transmitted to the second dummy electrode $DML_2$, and the second dummy signal $DSR_2$ is transmitted to the second dummy electrode $DMR_2$.

In this embodiment, the driving mode of the display device 3 can be column inversion driving or dot inversion driving, and the first dummy electrodes $DML_1$, $DMR_1$ and the corresponding data lines are electrically connected in the same manner as in the first embodiment. In order to prevent ions from accumulating at the edges of the first dummy electrodes $DML_1$, $DMR_1$ (for example, to prevent ions accumulating on the left side of the first dummy electrode $DML_1$ and the right side of the first dummy electrode $DMR_1$ in FIG. 10), the polarity of the second dummy electrode $DML_2$ is opposite to the polarity of the first dummy electrode $DML_1$, and the polarity of the second dummy electrode $DMR_2$ is opposite to the polarity of the first dummy electrode $DMR_1$ (the detailed reasons can refer to the description of FIG. 13). Therefore, in this embodiment, the second dummy electrode $DML_2$ is electrically connected to the corresponding data line to receive a pixel signal with a polarity opposite to the first dummy signal $DSL_1$, and the second dummy electrode $DMR_2$ is electrically connected to the corresponding data line to receive a pixel signal with a polarity opposite to the first dummy signal $DSR_1$.

Referring to FIG. 10, the array substrate 30 further includes a second connection line $CL_2$, and the second dummy electrode $DML_2$ is electrically connected to a $p^{th}$ data line among the first data line $DL_1$ to the $M^{th}$ data line $DL_M$ through the second connection line $CL_2$, where p is an odd number greater than or equal to 1 and less than or equal to M. As shown in FIG. 10, the second dummy electrode $DML_2$ is electrically connected to the first data line $DL_1$ through the second connection line $CL_2$, but is not limited thereto. In other embodiments, the second dummy electrode $DML_2$ may be electrically connected to one of the third data line $DL_3$, the fifth data line $DL_5$, the seventh data line $DL_7$, and so on, through the second connection line $CL_2$.

During a frame period, the first pixel unit column $PC_1$ receives the first pixel signal $PS_1$ through the first data line $DL_1$, the second pixel unit column $PC_2$ receives the second pixel signal $PS_2$ through the second data line $DL_2$, the first dummy electrode $DML_1$ is electrically connected to the second data line $DL_2$ through the first connection line $CL_1$ to receive the second pixel signal $PS_2$ as the first dummy signal $DSL_1$ (i.e., the first dummy signal $DSL_1$ is the same as the second pixel signal $PS_2$), and the second dummy electrode $DML_2$ is electrically connected to the first data line $DL_1$ through the second connection line $CL_2$ to receive the first pixel signal $PS_1$ as the second dummy signal $DSL_2$ (i.e., the second dummy signal $DSL_2$ is the same as the first pixel signal $PS_1$). The driving mode of the display device 3 of this embodiment can be column inversion driving or dot inversion driving. Therefore, during a frame period, the polarity of the first pixel signal $PS_1$ and the polarity of the first dummy signal $DSL_1$ are opposite to each other, and the polarity of the first dummy signal $DSL_1$ and the polarity of the second dummy signal $DSL_2$ are opposite to each other. That is, the polarity of the first pixel unit column $PC_1$ and the polarity of the first dummy electrode $DML_1$ adjacent to the first pixel unit column $PC_1$ are opposite to each other, and the polarity of the first dummy electrode $DML_1$ and the polarity of the second dummy electrode $DML_2$ adjacent to the first dummy electrode $DML_1$ are opposite to each other.

Referring to FIG. 10, the array substrate 30 further includes a second connection line $CR_2$. The second dummy electrode $DMR_2$ is electrically connected to an $(M-q)^{th}$ data line among the first data line $DL_1$ to the $M^{th}$ data line $DL_M$ through the second connection line $CR_2$, where q is 0 or an even number greater than 1 and less than M. As shown in FIG. 10, the second dummy electrode $DMR_2$ is electrically connected to the $M^{th}$ data line $DL_M$ through the second connection line $CR_2$, but is not limited thereto. In other embodiments, the second dummy electrode $DMR_2$ may be electrically connected to one of the $(M-2)^{th}$ data line $DL_{M-2}$, the $(M-4)^{th}$ data line $DL_{M-4}$, the $(M-6)^{th}$ data line $DL_{M-6}$, and so on, through the second connection line $CR_2$.

During a frame period, the $M^{th}$ pixel unit column $PC_M$ receives the $M^{th}$ pixel signal $PS_M$ through the $M^{th}$ data line $DL_M$, the $(M-1)^{th}$ pixel unit column $PC_{M-1}$ receives the $(M-1)^{th}$ pixel signal $PS_{M-1}$ through the $(M-1)^{th}$ data line $DL_{M-1}$, the first dummy electrode $DMR_1$ is electrically connected to the $(M-1)^{th}$ data line $DL_{M-1}$ through the first connection line $CR_1$ to receive the $(M-1)^{th}$ pixel signal $PS_{M-1}$ as the first dummy signal $DSR_1$ (i.e., the first dummy signal $DSR_1$ is the same as the $(M-1)^{th}$ pixel signal $PS_{M-1}$), and the second dummy electrode $DMR_2$ is electrically connected to the $M^{th}$ data line $DL_M$ through the second connection line $CR_2$ to receive the $M^{th}$ pixel signal $PS_M$ as the second dummy signal $DSR_2$ (i.e., the second dummy signal $DSR_2$ is the same as the $M^{th}$ pixel signal $PS_M$). The driving mode of the display device 3 of this embodiment can be column inversion driving or dot inversion driving. Therefore, during a frame period, the polarity of the $M^{th}$ pixel signal $PS_M$ and the polarity of the first dummy signal $DSR_1$ are opposite to each other, and the polarity of the first dummy signal $DSR_1$ and the polarity of the second dummy signal $DSR_2$ are opposite to each other. That is, the polarity of the $M^{th}$ pixel unit column $PC_M$ and the polarity of the first dummy electrode $DMR_1$ adjacent to the $M^{th}$ pixel unit column $PC_M$ are opposite to each other, and the polarity of the first dummy electrode $DMR_1$ and the polarity of the second dummy electrode $DMR_2$ adjacent to the first dummy electrode $DMR_1$ are opposite to each other.

Figure 11A:
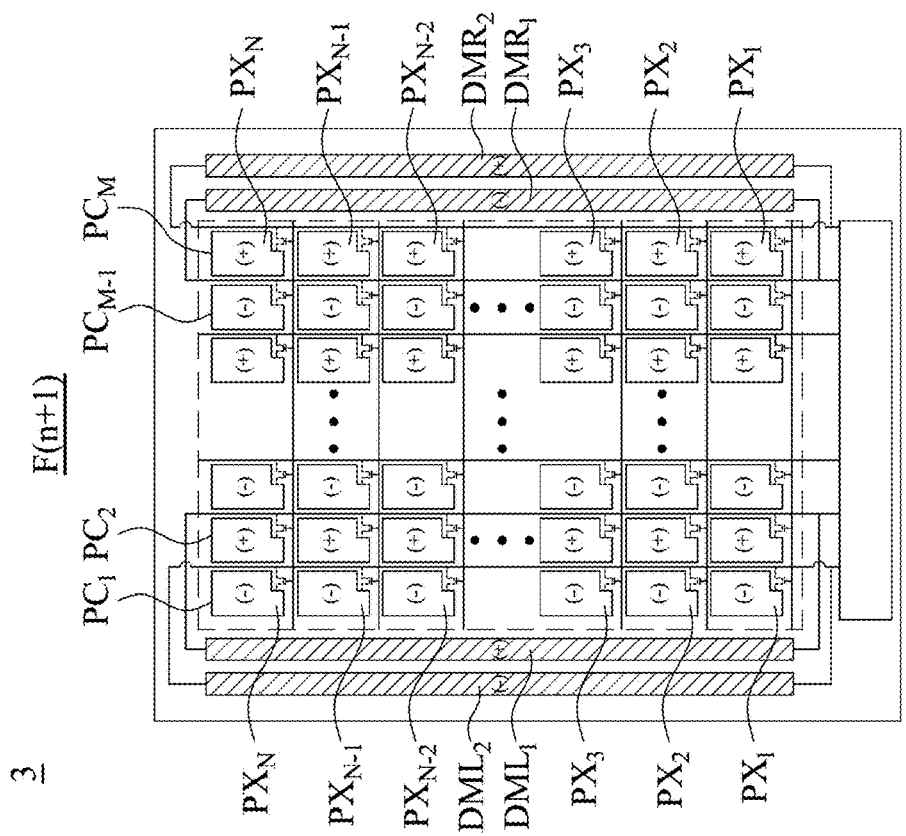
FIGS. 11A and 11B are respectively schematic diagrams of polarity configurations of pixel unit columns and dummy electrodes during two adjacent frame periods of a display device according to the second embodiment of the present disclosure.
Figure 11B:
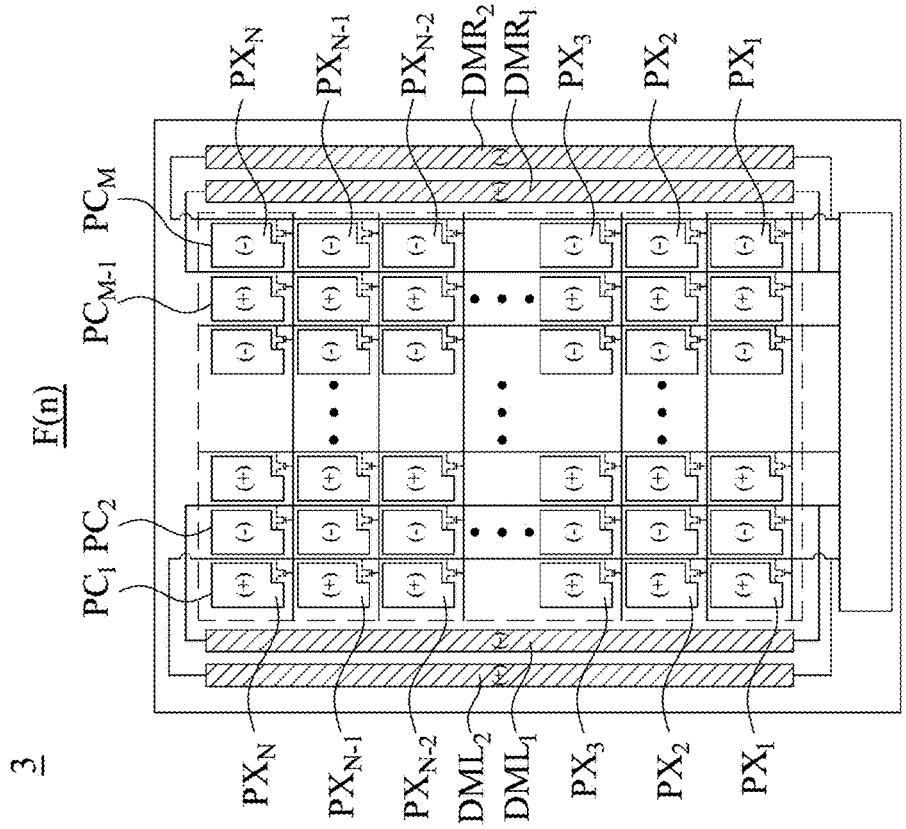
Figure 12:
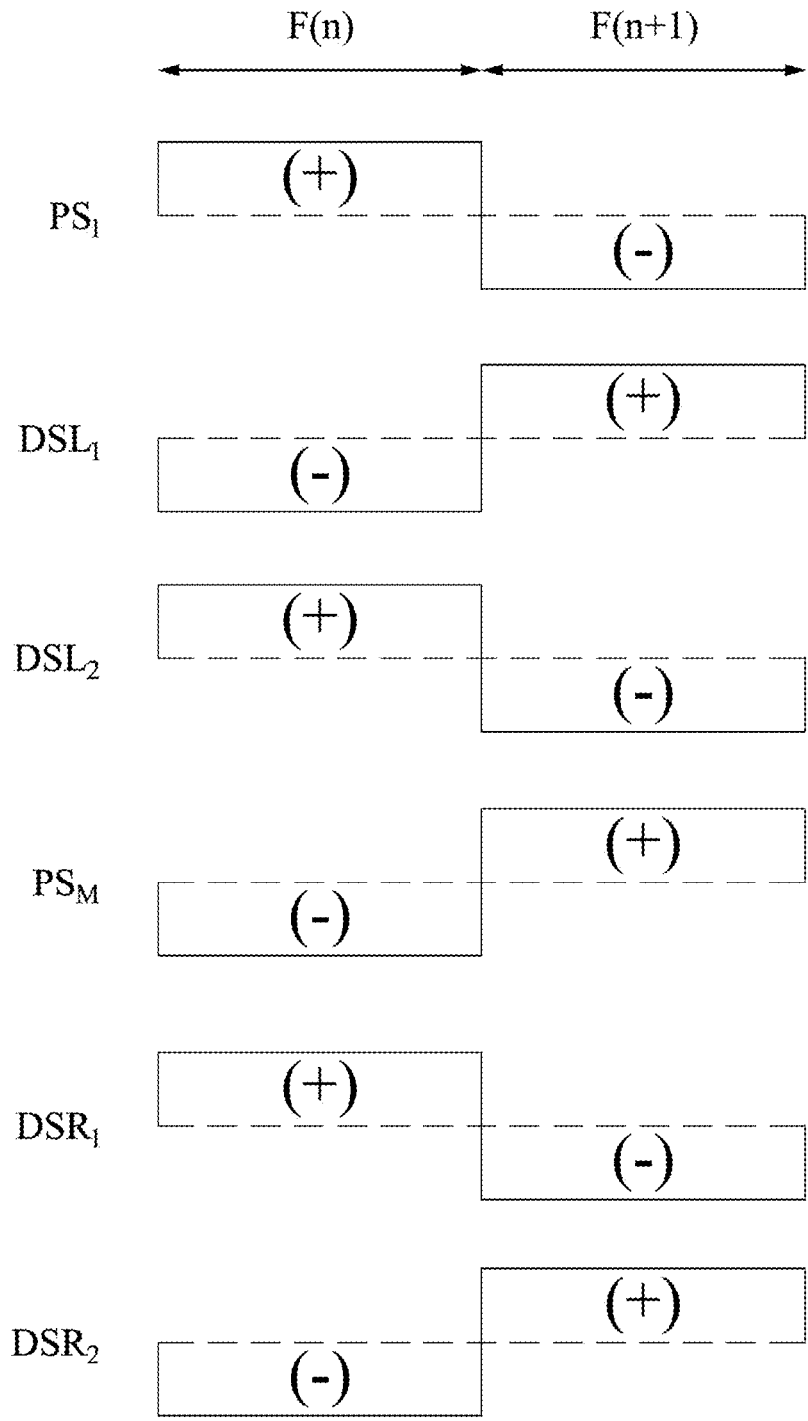
FIG. 12 is a schematic diagram of the polarity of pixel signals and dummy signals during two adjacent frame periods of a display device according to the second embodiment of the present disclosure.
Figure 13:
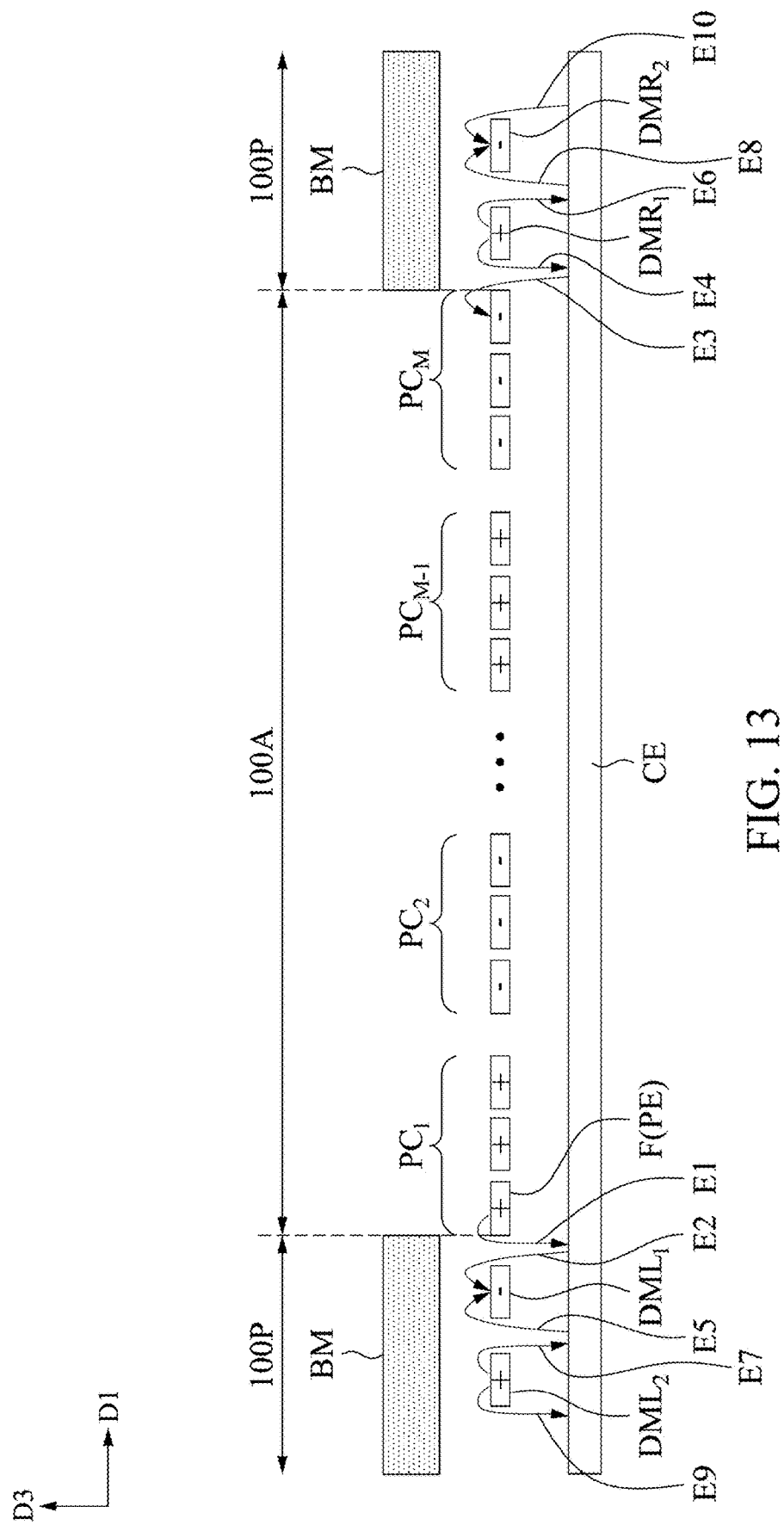
FIG. 13 is a schematic diagram of the electric field distribution of a display device according to the second embodiment of the present disclosure.

FIGS. 11A and 11B are respectively schematic diagrams of polarity configurations of pixel unit columns and dummy electrodes during two adjacent frame periods of the display device 3 according to the second embodiment of the present disclosure, where the driving mode of the display device 3 is column inversion driving. FIG. 11A shows the polarity configuration relationship of the first unit column $PC_1$ to the $M^{th}$ pixel unit column $PC_M$, the first dummy electrodes $DML_1$, $DMR_1$, and the second dummy electrodes $DML_2$, $DMR_2$ of the display device 3 in a frame period F(n). FIG. 11B shows the polarity configuration relationship of the first unit column $PC_1$ to the $M^{th}$ pixel unit column $PC_M$, the first dummy electrodes $DML_1$, $DMR_1$, and the second dummy electrodes $DML_2$, $DMR_2$ of the display device 3 in the next frame period F(n+1). FIG. 12 is a schematic diagram of the polarity of the first pixel signal $PS_1$, the first dummy signal $DSL_1$, the second dummy signal $DSL_2$, the $M^{th}$ pixel signal $PS_M$, the first dummy signal $DSR_1$ and the second dummy signal $DSR_2$ during the frame periods F(n), F(n+1). FIG. 13 is a schematic diagram of the electric field distribution between the first dummy electrodes $DML_1$, $DMR_1$ and common electrode CE, the electric field distribution between the second dummy electrodes $DML_2$, $DMR_2$ and common electrode CE, and the electric field distribution between the pixel electrode PE and the common electrode CE of the display device 3 of FIG. 11A. In FIG. 11A, FIG. 11B, FIG. 12 and FIG. 13, M is an even number (i.e., the number of pixel unit columns PC of the display device 3 is an even number) as an example, but is not limited to this. In other embodiments, M may be an odd number.

Referring to FIG. 10, FIG. 11A, FIG. 12, and FIG. 13, during the frame period F(n), the polarity of the first pixel signal $PS_1$ (i.e., the second dummy signal $DSL_2$), the polarity of the second pixel signal $PS_2$ (i.e., the first dummy signal $DSL_1$), the polarity of the $(M-1)^{th}$ pixel signal $PS_{M-1}$ (i.e., the first dummy signal $DSR_1$) and the polarity of the $M^{th}$ pixel signal $PS_M$ (i.e., the second dummy signal $DSR_2$) are positive, negative, positive, negative respectively. Therefore, the second dummy electrode $DML_2$ is with positive polarity, the first dummy electrode $DML_1$ is with negative polarity, the first pixel unit $PX_1$ to the $N^{th}$ pixel unit $PX_N$ of the first pixel unit column $PC_1$ are all with positive polarity, the first pixel unit $PX_1$ to the $N^{th}$ pixel unit $PX_N$ of the second pixel unit column $PC_2$ are all with negative polarity, the first pixel unit $PX_1$ to the $N^{th}$ pixel unit $PX_N$ of the $(M-1)^{th}$ pixel unit column $PC_{M-1}$ are all with positive polarity, the first pixel unit $PX_1$ to the $N^{th}$ pixel unit $PX_N$ of the $M^{th}$ pixel unit column $PC_M$ are all with negative polarity, the first dummy electrode $DMR_1$ is with positive polarity, and the second dummy electrode $DMR_2$ is with positive polarity. That is, the polarity of the second dummy electrode $DML_2$, the polarity of the first dummy electrode $DML_1$, the polarity of the first pixel unit column $PC_1$ to the polarity of the $M^{th}$ pixel unit column $PC_M$, the polarity of the first dummy electrode $DMR_1$, and the polarity of the second dummy electrode $DMR_2$ are arranged in the order of positive, negative, positive, negative, and so on (i.e., are arranged in a positive-negative alternating manner).

As shown in FIG. 11A and FIG. 13, during the frame period F(n), the polarity (i.e., negative polarity) of the first dummy electrode $DML_1$ is opposite to the polarity (i.e., positive polarity) of the second dummy electrode $DML_2$, so the electric field E7 between the second dummy electrode $DML_2$ and the common electrode CE is opposite to the electric field E5 between the first dummy electrode $DML_1$ and the common electrode CE, thereby preventing the accumulation of ions at the edge of the first dummy electrode $DML_1$. Similarly, the polarity (i.e., positive polarity) of the first dummy electrode $DMR_1$ is opposite to the polarity (i.e., negative polarity) of the second dummy electrode $DMR_2$, so the electric field E8 between the second dummy electrode $DMR_2$ and the common electrode CE is opposite to the electric field E6 between the first dummy electrode $DMR_1$ and the common electrode CE, thereby preventing the accumulation of ions at the edge of the first dummy electrode $DMR_1$. It should be noted that although the electric field E9 between the second dummy electrode $DML_2$ and the common electrode CE and the electric field E10 between the second dummy electrode $DMR_2$ and the common electrode CE in FIG. 13 do not have corresponding opposite electric fields, ions may accumulate in the left side of the second dummy electrode $DML_2$ and the right side of the second dummy electrode $DMR_2$, but the second dummy electrodes $DML_2$, $DMR_2$ are located in the peripheral area 100P, and the light shielding layer BM overlaps the second dummy electrodes $DML_2$, $DMR_2$ in the third direction D3. Therefore the display quality of the display device 3 is not affected. The electric fields E1-E6 in FIG. 13 are respectively similar to the electric fields E1-E6 in FIG. 6 and can be referred to the description of FIG. 6, which will not be repeated here. Referring to FIG. 6 and FIG. 13, compared with FIG. 6, FIG. 13 further has the second dummy electrodes $DML_2$, $DMR_2$ with opposite polarities to the first dummy electrodes $DML_1$, $DMR_1$ respectively. Therefore, the ion accumulation region can be further away from the display area 100A (for example, the ion accumulation region in FIG. 6 is located on the left side of the first dummy electrode $DML_1$ and the right side of the first dummy electrode $DMR_1$, while the ion accumulation region in FIG. 13 is located on the left side of the second dummy electrode $DML_2$ and the right side of the second dummy electrode $DMR_2$ further away from of the display area 100A), so as to further enhance the reliability of the display device 3.

As shown in FIG. 10, FIG. 11B, and FIG. 12, during the next frame period F(n+1), the polarity of the first pixel signal $PS_1$ (i.e., the second dummy signal $DSL_2$), the polarity of the second pixel signal $PS_2$ (i.e., the first dummy signal $DSL_1$), the polarity of the $(M-1)^{th}$ pixel signal $PS_{M-1}$ (i.e., the first dummy signal $DSR_1$) and the polarity of the $M^{th}$ pixel signal $PS_M$ (i.e., the second dummy signal $DSR_2$) are negative, positive, negative, positive respectively. Therefore, the second dummy electrode $DML_2$ is with negative polarity, the first dummy electrode $DML_1$ is with positive polarity, the first pixel unit $PX_1$ to the $N^{th}$ pixel unit $PX_N$ of the first pixel unit column $PC_1$ are all with negative polarity, the first pixel unit $PX_1$ to the $N^{th}$ pixel unit $PX_N$ of the second pixel unit column $PC_2$ are all with positive polarity, the first pixel unit $PX_1$ to the $N^{th}$ pixel unit $PX_N$ of the $(M-1)^{th}$ pixel unit column $PC_{M-1}$ are all with negative polarity, the first pixel unit $PX_1$ to the $N^{th}$ pixel unit $PX_N$ of the $M^{th}$ pixel unit column $PC_M$ are all with positive polarity, the first dummy electrode $DMR_1$ is with negative polarity, and the second dummy electrode $DMR_2$ is with positive polarity. That is, the polarity of the second dummy electrode $DML_2$, the polarity of the first dummy electrode $DML_1$, the polarity of the first pixel unit column $PC_1$ to the polarity of the $M^{th}$ pixel unit column $PC_M$, the polarity of the first dummy electrode $DMR_1$, and the polarity of the second dummy electrode $DMR_2$ are arranged in the order of negative, positive, negative, positive, and so on (i.e., are arranged in a negative-positive alternating manner). The electric field distribution diagram corresponding to FIG. 11B can be obtained by reversing the polarity of the pixel electrodes PE of each pixel unit column, the first dummy electrodes $DML_1$, $DMR_1$ and the second dummy electrodes $DML_2$, $DMR_2$ in FIG. 13 and reversing the directions of the electric fields E1-E10. Similarly, during the next frame period F(n+1), the electric field E7 is opposite to the electric field E5, and the electric field E8 is opposite to the electric field E6, the ion accumulation region can be further away from the display area 100A, so as to further enhance the reliability of the display device 3.

In FIG. 11A, FIG. 11B and FIG. 12, the driving mode of the display device 3 is column inversion driving, but is not limited thereto. In other embodiments, the driving mode of the display device 3 can use dot inversion driving, which can also avoid the accumulation of ions at the edges of the first dummy electrodes $DML_1$, $DMR_1$.

Figure 14:
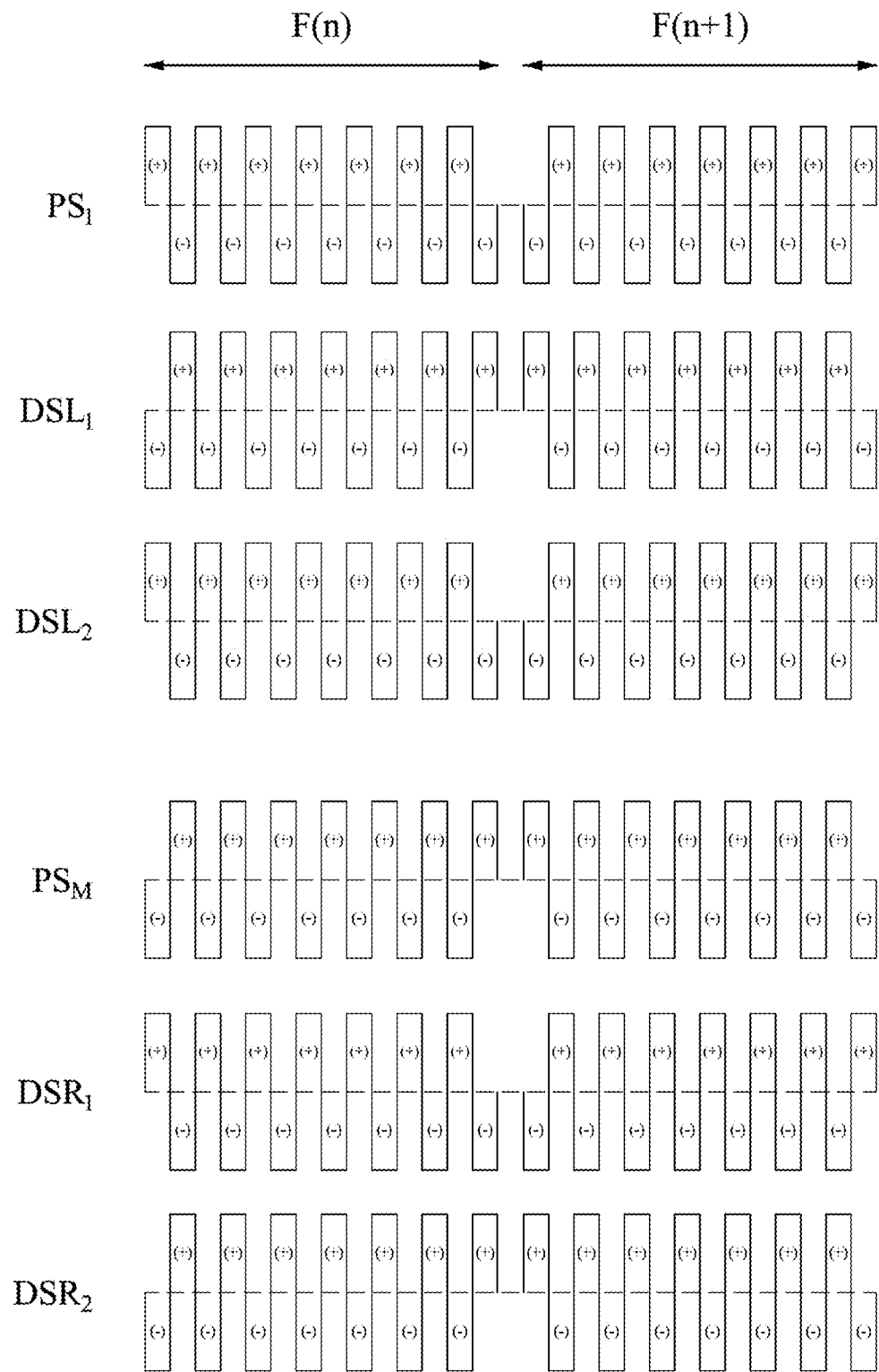
FIG. 14 is another schematic diagram of the polarity of pixel signals and dummy signals during two adjacent frame periods of a display device according to the second embodiment of the present disclosure.

FIG. 14 is another schematic diagram of the polarity of the first pixel signal $PS_1$, the first dummy signal $DSL_1$, $DSR_1$, the $M^{th}$ pixel signal $PS_M$ and the second dummy signal $DSL_2$, $DSR_2$ during two adjacent frame periods of the display device 3 according to the second embodiment of the present disclosure, where the driving mode of the display device 3 is dot inversion driving. As shown in FIG. 10 and FIG. 14, in each frame period F(n), F(n+1), each of the first pixel signal $PS_1$, the first dummy signal $DSL_1$, $DSR_1$, the $M^{th}$ pixel signal $PS_M$, and the second dummy signal $DSL_2$, $DSR_2$ has multiple switches of positive polarity and negative polarity, where the polarity of the first pixel signal $PS_1$ is opposite to the polarity of the first dummy signal $DSL_1$, the polarity of the first dummy signal $DSL_1$ is opposite to the polarity of the second dummy signal $DSL_2$, the polarity of the $M^{th}$ pixel signal $PS_M$ is opposite to the polarity of the first dummy signal $DSR_1$, and the polarity of the first dummy signal $DSR_1$ is opposite to the polarity of the second dummy signal $DSR_2$.

Figure 15:
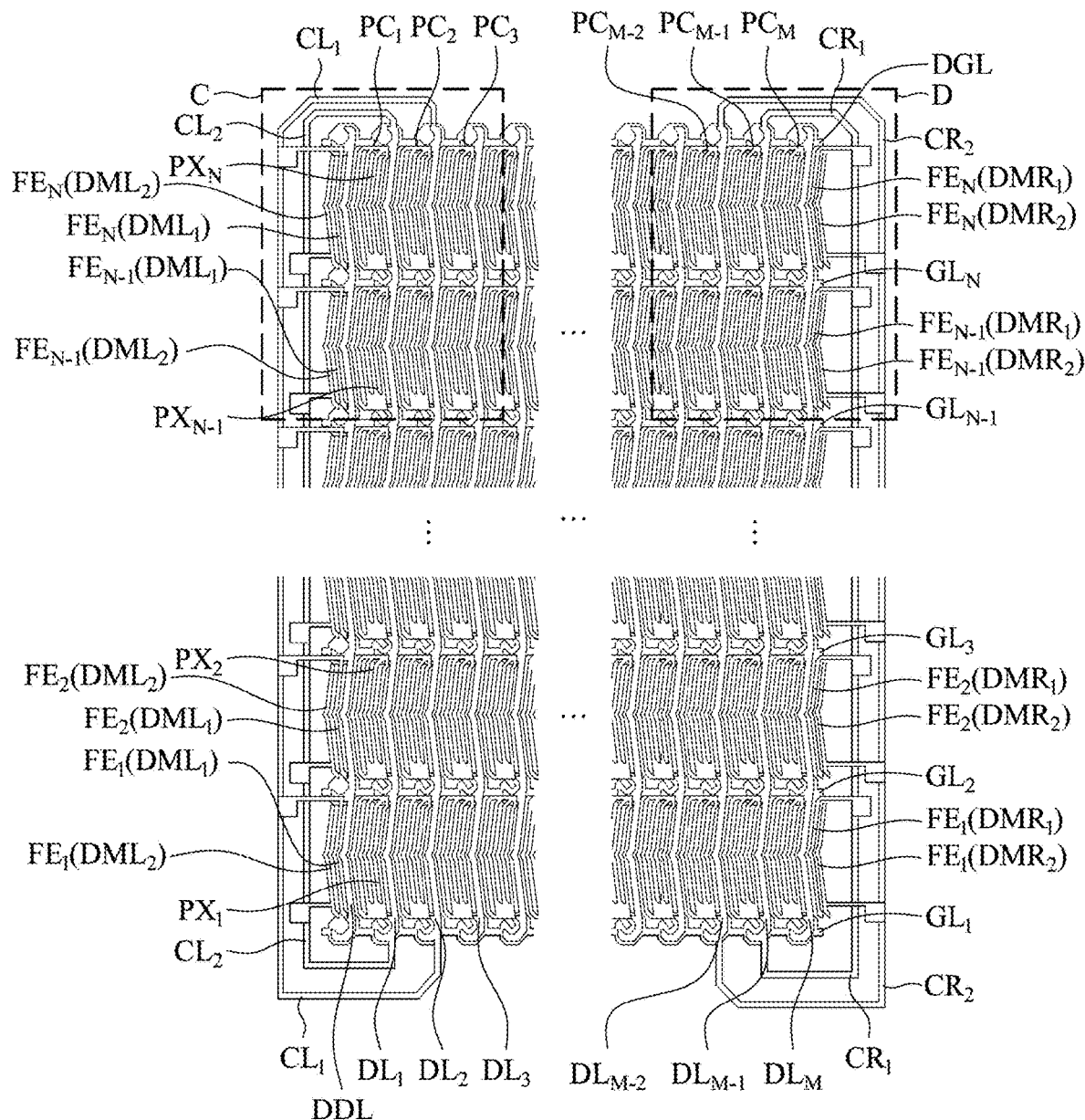
FIG. 15 is a simplified layout diagram of a display device according to the second embodiment of the present disclosure.
Figures 16A, 16B:
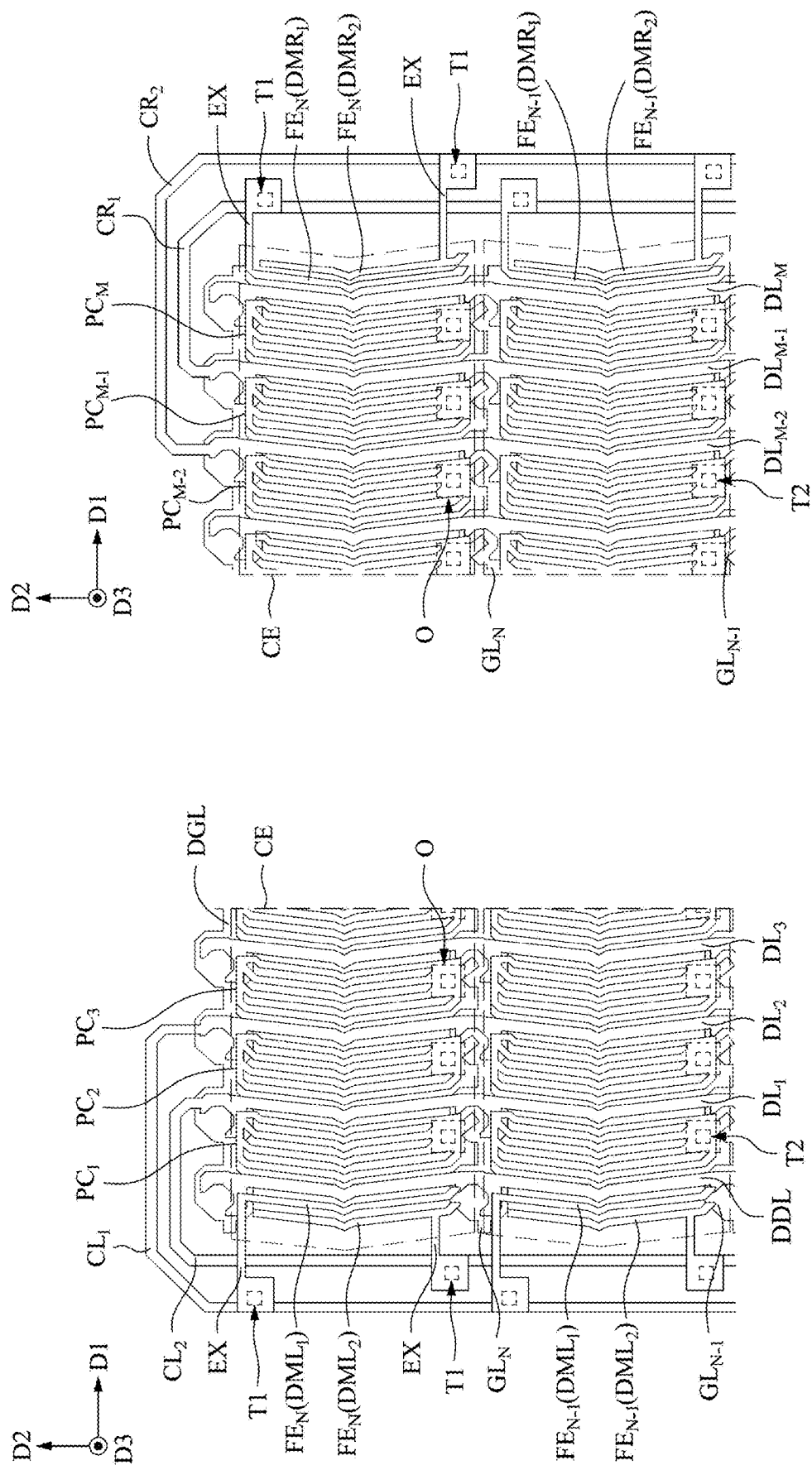
FIGS. 16A and 16B are respectively enlarged views of different regions in FIG. 15.

FIG. 15 is a simplified layout diagram of a display device 3 according to the second embodiment of the present disclosure. FIGS. 16A and 16B are respectively enlarged views of the regions C, D in FIG. 15. For the sake of simplicity, FIG. 15 omits the drawing of the common electrode CE, and the description of the common electrode CE can be found in FIG. 16A and FIG. 16B. In addition, in order to facilitate the illustration of the layout diagram of this embodiment, although FIG. 10 illustrates that the second dummy electrode $DMR_2$ is electrically connected to the $M^{th}$ data line $DL_M$, the layout diagrams of FIG. 15 and FIG. 16B illustrate that the second dummy electrode $DMR_2$ is electrically connected to the $(M-2)^{th}$ data line $DL_{M-2}$ as an example. The structures, the materials, the manufacturing processes and the relative positions of most elements of the embodiments of FIG. 15 and FIG. 8 are the same, so the same features are not repeated here. The main difference between FIG. 15 and FIG. 8 is that the array substrate 30 of the display device 3 of FIG. 15 further includes second dummy electrodes $DML_2$, $DMR_2$, which are adjacent to the first dummy electrodes $DML_1$, $DMR_1$ respectively. The second dummy electrode $DML_2$ is electrically connected to the first data line $DL_1$ through the second connection line $CL_2$, and the second dummy electrode $DMR_2$ is electrically connected to the $(M-2)^{th}$ data line $DL_{M-2}$ through the second connection line $CR_2$.

As shown in FIG. 15, each of the second dummy electrodes $DML_2$, $DMR_2$ includes N number of strip electrodes $FE_1$-$FE_N$. The N number of strip electrodes $FE_1$-$FE_N$ include a first strip electrode $FE_1$ to an $N^{th}$ strip electrode $FE_N$ electrically connected to each other. The first strip electrode $FE_1$ to the $N^{th}$ strip electrode $FE_N$ of the second dummy electrode $DML_2$ are respectively adjacent to the first strip electrode $FE_1$ to the $N^{th}$ strip electrode $FE_N$ of the first dummy electrode $DML_1$, and the first strip electrode $FE_1$ to the $N^{th}$ strip electrode $FE_N$ of the second dummy electrode $DMR_2$ are respectively adjacent to the first strip electrode $FE_1$ to the $N^{th}$ strip electrode $FE_N$ of the first dummy electrode $DMR_1$. In this embodiment, the first strip electrode $FE_1$ to the $N^{th}$ strip electrode $FE_N$ of the first dummy electrodes $DML_1$, $DMR_1$ and the second dummy electrodes $DML_2$, $DMR_2$ may be the same film layer as the pixel electrodes PE of the first pixel unit $PX_1$ to the $N^{th}$ pixel unit $PX_N$ (for example, a transparent conductive layer may include the first strip electrode $FE_1$ to the $N^{th}$ strip electrode $FE_N$ of the first dummy electrodes $DML_1$, $DMR_1$ and the second dummy electrodes $DML_2$, $DMR_2$ and the pixel electrodes PE of the first pixel unit $PX_1$ to the $N^{th}$ pixel unit $PX_N$), and/or the shapes of the first strip electrode $FE_1$ to the $N^{th}$ strip electrode $FE_N$ of the first dummy electrodes $DML_1$, $DMR_1$ and the second dummy electrodes $DML_2$, $DMR_2$ in the top view may be the same as the shapes of the strip parts F of the pixel electrodes PE of the first pixel unit $PX_1$ to the $N^{th}$ pixel unit $PX_N$ in the top view, but are not limited thereto.

Each of the second dummy electrodes $DML_2$, $DMR_2$ further includes an extension part EX electrically connected the second connection lines $CL_2$, $CR_2$ respectively. Specifically, as shown in FIG. 16A, the strip electrode $FE_N$ of the second dummy electrode $DML_2$ is electrically connected to the second connection lines $CL_2$ through the extension part EX and the first through hole T1, and as shown in FIG. 16B, the strip electrode $FE_N$ of the second dummy electrode $DMR_2$ is electrically connected to the second connection line $CR_2$ through another extension part EX and another first through hole T1.

Figure 17:
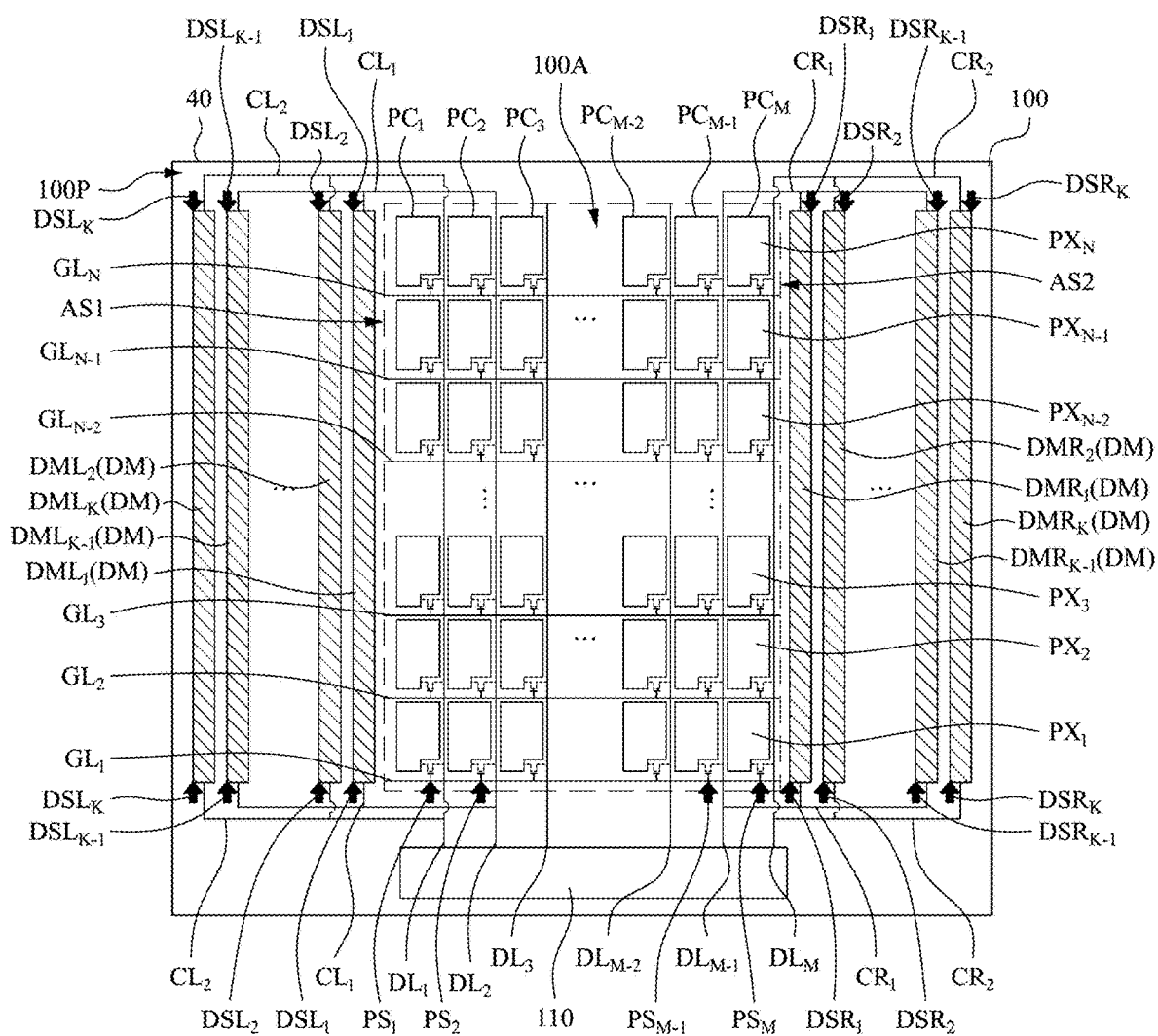
FIG. 17 is a schematic view of a display device according to a third embodiment of the present disclosure.

FIG. 17 is a schematic view of a display device 4 according to a third embodiment of the present disclosure. The structures, the materials, the manufacturing processes and the relative positions of most elements of the embodiments of FIG. 17 and FIG. 10 are the same, so the same features are not repeated here. The main difference between FIG. 17 and FIG. 10 is that the display device 4 of this embodiment includes at least three dummy electrodes disposed in the peripheral area 100P next to the first side AS1 of the display area 100A and another at least three dummy electrodes disposed in the peripheral area 100P next to the second side AS2 of the display area 100A. As shown in FIG. 17, the dummy electrode group DM of the display device 4 includes a first dummy electrode $DML_1$ to an $K^{th}$ dummy electrode $DML_K$ and a first dummy electrode $DMR_1$ to an $K^{th}$ dummy electrode $DMR_K$, which are disposed on the substrate 100 and located in the peripheral area 100P, where K is a positive integer greater than 2. The first dummy electrode $DML_1$ to the $K^{th}$ dummy electrode $DML_K$ are sequentially arranged in a direction opposite to the first direction D1. The first dummy electrode $DML_1$ is adjacent to the first pixel unit column $PC_1$, and the second dummy electrode $DML_2$ is adjacent to the first dummy electrode $DML_1$, and so on, the $K^{th}$ dummy electrode $DML_K$ is adjacent to the $(K-1)^{th}$ dummy electrode $DML_{K-1}$. The first dummy electrode $DMR_1$ to the $K^{th}$ dummy electrode $DMR_K$ are sequentially arranged in the first direction D1. The first dummy electrode $DMR_1$ is adjacent to the $M^{th}$ pixel unit column $PC_M$, and the second dummy electrode $DMR_2$ is adjacent to the first dummy electrode $DMR_1$, and so on, the $K^{th}$ dummy electrode $DMR_K$ is adjacent to the $(K-1)^{th}$ dummy electrode $DMR_{K-1}$. K Is an even number as an example in FIG. 17, but is not limited thereto.

In this embodiment, the driving mode of the display device 4 can be column inversion driving or dot inversion driving, and the first dummy electrodes $DML_1$, $DMR_1$, the second dummy electrodes $DML_2$, $DMR_2$ and the corresponding data lines are electrically connected in the same manner as in the second embodiment. In order to prevent ions from accumulating at the edge of the first pixel unit column $PC_1$ and at the edge of any one of the first dummy electrode $DML_1$ to the $(K-1)^{th}$ dummy electrode $DML_{K-1}$ to make the ion accumulation region be further away from the display area 100A, the polarity of the first pixel unit column $PC_1$ and the polarity of the first dummy electrode $DML_1$ are opposite to each other, and the polarities of any two adjacent dummy electrodes among the first dummy electrode $DML_1$ to the $K^{th}$ dummy electrode $DML_K$ are opposite to each other. Therefore, the odd-numbered dummy electrodes (for example, the first dummy electrode $DML_1$, the third dummy electrode, and so on) among the first dummy electrode $DML_1$ to the $K^{th}$ dummy electrode $DML_K$ are electrically connected to at least one $i^{th}$ data line among the first data line $DL_1$ to the $M^{th}$ data line $DL_M$ through the first connection line $CL_1$ of the array substrate 40, where i is an even number greater than 1 and less than or equal to M, and the even-numbered dummy electrodes (for example, the second dummy electrode $DML_2$, the fourth dummy electrode, and so on) among the first dummy electrodes $DML_1$ to the $K^{th}$ dummy electrode $DML_K$ are electrically connected to at least one $p^{th}$ data line among the first data line $DL_1$ to the $M^{th}$ data line $DL_M$ through the second connection line $CL_2$, where p is an odd number greater than or equal to 1 and less than or equal to M. In FIG. 17, the odd-numbered dummy electrodes are electrically connected to the same data line (e.g., the second data line $DL_2$) and the even-numbered dummy electrodes are electrically connected to the same data line (e.g., the first data line $DL_1$) as an example, but are not limited thereto. In other embodiments, at least a portion of the odd-numbered dummy electrodes are electrically connected to different data lines (e.g., electrically connected to at least two data lines among the second data line $DL_2$, the fourth data line, the sixth data line, and so on), and/or at least a portion of the even-numbered dummy electrodes are electrically connected to different data lines (e.g., electrically connected to at least two data lines among the first data line $DL_1$, the third data line $DL_3$, the fifth data line, and so on).

During a frame period, the first pixel unit column $PC_1$ receives the first pixel signal $PS_1$, the second pixel unit column $PC_2$ receives the second pixel signal $PS_2$, and FIG. 17 illustrate that the odd-numbered dummy electrodes among the first dummy electrodes $DML_1$ to the $K^{th}$ dummy electrode $DML_K$ receive the second pixel signal $PS_2$ as the dummy signal (i.e., the dummy signals of the odd-numbered dummy electrodes are the same as the second pixel signal $PS_2$), and the even-numbered dummy electrodes among the first dummy electrodes $DML_1$ to the $K^{th}$ dummy electrode $DML_K$ receive the first pixel signal $PS_1$ as the dummy signal (i.e., the dummy signals of the even-numbered dummy electrodes are the same as the first pixel signal $PS_1$) as an example. The driving mode of the display device 4 of this embodiment can be column inversion driving or dot inversion driving. Therefore, during a frame period, the polarity of the first pixel signal $PS_1$ and the polarity of the first dummy signal $DSL_1$ are opposite to each other, and the polarities of the dummy signals received by any two adjacent dummy electrodes among the first dummy electrode $DML_1$ to the $K^{th}$ dummy electrode $DML_K$ are opposite to each other. That is, the polarity of the first pixel unit column $PC_1$ and the polarity of the first dummy electrode $DML_1$ adjacent to the first pixel unit column $PC_1$ are opposite to each other, and the polarities of any two adjacent dummy electrodes among the first dummy electrode $DML_1$ to the $K^{th}$ dummy electrode $DML_K$ are opposite to each other. Therefore, the electric field between the pixel units PX of the first pixel unit column $PC_1$ and the common electrode CE is opposite to the electric field between the first dummy electrode $DML_1$ and the common electrode CE, and the electric field between one of two adjacent dummy electrodes among the first dummy electrode $DML_1$ to the $K^{th}$ dummy electrode $DML_K$ and the common electrode CE and the electric field between the other one of the two adjacent dummy electrodes and the common electrode CE are opposite to each other. Compared with the second embodiment, the ion accumulation region can be further away from the display area 100A, so as to further enhance the reliability of the display device 4.

Referring to FIG. 17, in order to prevent ions from accumulating at the edge of the $M^{th}$ pixel unit column $PC_M$ and at the edge of any one of the first dummy electrode $DMR_1$ to the $(K-1)^{th}$ dummy electrode $DMR_{K-1}$ to make the ion accumulation region be further away from the display area 100A, the polarity of the $M^{th}$ pixel unit column $PC_M$ and the polarity of the first dummy electrode $DMR_1$ are opposite to each other, and the polarities of any two adjacent dummy electrodes among the first dummy electrode $DMR_1$ to the $K^{th}$ dummy electrode $DMR_K$ are opposite to each other. Therefore, the odd-numbered dummy electrodes (for example, the first dummy electrode $DMR_1$, the third dummy electrode, and so on) among the first dummy electrode $DMR_1$ to the $K^{th}$ dummy electrode $DMR_K$ are electrically connected to at least one $(M-j)^{th}$ data line among the first data line $DL_1$ to the $M^{th}$ data line $DL_M$ through the first connection line $CR_1$, where j is an odd number greater than or equal to 1 and less than M, and the even-numbered dummy electrodes (for example, the second dummy electrode $DMR_2$, the fourth dummy electrode, and so on) among the first dummy electrodes $DML_1$ to the $K^{th}$ dummy electrode $DML_K$ are electrically connected to at least one $(M-q)^{th}$ data line among the first data line $DL_1$ to the $M^{th}$ data line $DL_M$ through the second connection line $CR_2$, where q is an even number equal to 0 or greater than 1 and less than M. In FIG. 17, the odd-numbered dummy electrodes among the first dummy electrode $DMR_1$ to the $K^{th}$ dummy electrode DMR are electrically connected to the same data line (e.g., the $(M-1)^{th}$ data line $DL_{M-1}$) and the even-numbered dummy electrodes among the first dummy electrode $DMR_1$ to the $K^{th}$ dummy electrode $DMR_K$ are electrically connected to the same data line (e.g., the $M^{th}$ data line $DL_M$) as an example, but are not limited thereto. In other embodiments, at least a portion of the odd-numbered dummy electrodes among the first dummy electrode $DMR_1$ to the $K^{th}$ dummy electrode $DMR_K$ are electrically connected to different data lines (e.g., electrically connected to at least two data lines among the $(M-1)^{th}$ data line $DL_{M-1}$, the $(M-3)^{th}$ data line, the $(M-5)^{th}$ data line, and so on), and/or at least a portion of the even-numbered dummy electrodes among the first dummy electrode $DMR_1$ to the $K^{th}$ dummy electrode $DMR_K$ are electrically connected to different data lines (e.g., electrically connected to at least two data lines among the $M^{th}$ data line $DL_M$, the $(M-2)^{th}$ data line $DL_{M-2}$, the $(M-4)^{th}$ data line, and so on).

During a frame period, the $(M-1)^{th}$ pixel unit column $PC_{M-1}$ receives the $(M-1)^{th}$ pixel signal $PS_{M-1}$, the $M^{th}$ pixel unit column $PC_M$ receives the $M^{th}$ pixel signal $PS_M$, and FIG. 17 illustrate that the odd-numbered dummy electrodes among the first dummy electrodes $DMR_1$ to the $K^{th}$ dummy electrode $DMR_K$ receive the $(M-1)^{th}$ pixel signal $PS_{M-1}$ as the dummy signal (i.e., the dummy signals of the odd-numbered dummy electrodes among the first dummy electrodes $DMR_1$ to the $K^{th}$ dummy electrode $DMR_K$ are the same as the $(M-1)^{th}$ pixel signal $PS_{M-1}$), and the even-numbered dummy electrodes among the first dummy electrodes $DMR_1$ to the $K^{th}$ dummy electrode $DMR_K$ receive the $M^{th}$ pixel signal $PS_M$ as the dummy signal (i.e., the dummy signals of the even-numbered dummy electrodes among the first dummy electrodes $DMR_1$ to the $K^{th}$ dummy electrode $DMR_K$ are the same as the $M^{th}$ pixel signal $PS_M$) as an example. The driving mode of the display device 4 of this embodiment can be column inversion driving or dot inversion driving. Therefore, during a frame period, the polarity of the $M^{th}$ pixel signal $PS_M$ and the polarity of the first dummy signal $DSR_1$ are opposite to each other, and the polarities of the dummy signals received by any two adjacent dummy electrodes among the first dummy electrode $DMR_1$ to the $K^{th}$ dummy electrode $DMR_K$ are opposite to each other. For example, the polarity of the $K^{th}$ dummy signal $DSR_K$ and the polarity of the $(K-1)^{th}$ dummy signal $DSR_{K-1}$ are opposite to each other. That is, the polarity of the $M^{th}$ pixel unit column $PC_M$ and the polarity of the first dummy electrode $DMR_1$ adjacent to the $M^{th}$ pixel unit column $PC_M$ are opposite to each other, and the polarities of any two adjacent dummy electrodes among the first dummy electrode $DMR_1$ to the $K^{th}$ dummy electrode $DMR_K$ are opposite to each other. Therefore, the electric field between the pixel units PX of the $M^{th}$ pixel unit column $PC_M$ and the common electrode CE is opposite to the electric field between the first dummy electrode $DMR_1$ and the common electrode CE, and the electric field between one of two adjacent dummy electrodes among the first dummy electrode $DMR_1$ to the $K^{th}$ dummy electrode $DMR_K$ and the common electrode CE and the electric field between the other one of the two adjacent dummy electrodes and the common electrode CE are opposite to each other. Compared with the first embodiment and the second embodiment, the ion accumulation region can be further away from the display area 100A, so as to further enhance the reliability of the display device 4.

In this embodiment, by setting at least three dummy electrodes on one side of the first pixel unit column $PC_1$ (i.e., the side of the first pixel unit column $PC_1$ opposite to the second pixel unit column $PC_2$) and another at least three dummy electrodes on one side of the $M^{th}$ pixel unit column $PC_M$ (i.e., the side of the $M^{th}$ pixel unit column $PC_M$ opposite to the $(M-1)^{th}$ pixel unit column $PC_{M-1}$), the ion accumulation region can be further away from the display area 100A, so as to further enhance the reliability of the display device 4. Furthermore, in this embodiment, the maximum value of K may be the number of the strip parts F of the pixel electrode PE in one pixel unit PX.

In the above-mentioned first to third embodiments, the dummy electrodes in the dummy electrode group DM are electrically connected to corresponding data lines among the first data line $DL_1$ to the $M^{th}$ data line $DL_M$ to receive pixel signals as the dummy signals of the dummy electrode group DM. In the following fourth and fifth embodiments, the dummy electrodes in the dummy electrode group DM are electrically connected to at least one dummy pad of the driving circuit, and the dummy signals are transmitted to the dummy electrode group DM through the dummy pads.

Figure 18:
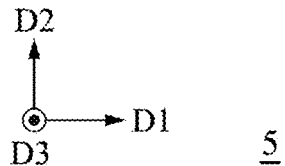
FIG. 18 is a schematic view of a display device according to a fourth embodiment of the present disclosure.
Figure 18:
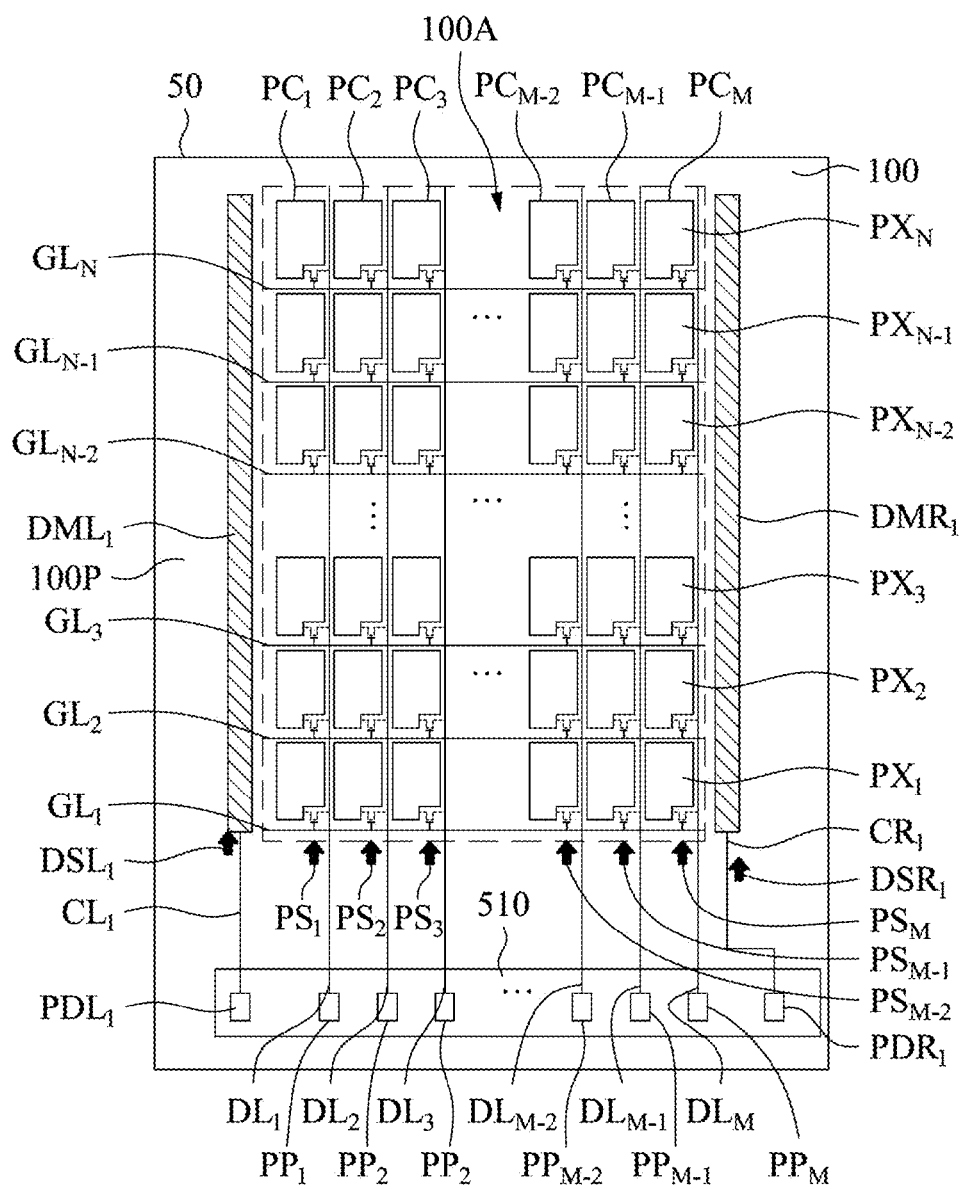

FIG. 18 is a schematic view of a display device 5 according to the fourth embodiment of the present disclosure. The structures, the materials, the manufacturing processes and the relative positions of most elements of the embodiments of FIG. 18 and FIG. 3 are the same, so the same features are not repeated here. The main difference between this embodiment and the first embodiment is that the first dummy electrode in this embodiment is electrically connected to at least one dummy pad of the driving circuit, and a dummy signal is transmitted to the first dummy electrode through the dummy pad. As shown in FIG. 18, the driving circuit 510 of the display device 5 includes M number of data pads $PP_1$-$PP_M$ and first dummy pads $PDL_1$, $PDR_1$. The M number of data pads $PP_1$-$PP_M$ include a first data pad $PP_1$ to an $M^{th}$ data pad $PP_M$, which are electrically connected to the first data line $DL_1$ to the $M^{th}$ data line $DL_M$ respectively. The first dummy electrode $DML_1$ is electrically connected to the first dummy pad $PDL_1$. In some embodiments, the driving circuit 510 may be disposed in at least one chip, but is not limited thereto. In FIG. 18, the driving circuit 510 is provided on the substrate 100, but is not limited thereto. In other embodiments, the driving circuit 510 may be disposed on a circuit board, and the circuit board is electrically connected to pads disposed on the substrate 100. During the frame period, the driving circuit 510 transmits the first pixel signal $PS_1$ to the $M^{th}$ pixel signal $PS_M$ to the first pixel unit column $PC_1$ to the $M^{th}$ pixel unit column $PC_M$ respectively, and the driving circuit 510 transmits the first dummy signal $DSL_1$ to the first dummy electrode $DML_1$. In some embodiments, the first dummy electrode $DML_1$ is electrically connected to the first dummy pad $PDL_1$ through the first connection line $CL_1$ of the array substrate 50.

In addition, as shown in FIG. 18, the first dummy electrode $DMR_1$ is electrically connected to the first dummy pad $PDR_1$. During the frame period, the driving circuit 510 further transmits the first dummy signal $DSR_1$ to the first dummy electrode $DMR_1$. In some embodiments, the first dummy electrode $DMR_1$ is electrically connected to the first dummy pad $PDR_1$ through the first connection line $CR_1$ of the array substrate 50.

In the first to third embodiments, at least one pixel signal among the first pixel signal $PS_1$ to the $M^{th}$ pixel signal $PS_M$ is used as the first dummy signals $DSL_1$, $DSR_1$. Compared with the first to third embodiments, this embodiment uses the driving circuit 510 to provide the first dummy signals $DSL_1$, $DSR_1$ to the first dummy electrodes $DML_1$, $DMR_1$ respectively, so the first dummy signals $DSL_1$, $DSR_1$ can be independent of the first pixel signal $PS_1$ to the $M^{th}$ pixel signal $PS_M$, but is not limited thereto. During a frame period, the driving circuit 510 may transmit the first dummy signals $DSL_1$, $DSR_1$ to the first dummy electrodes $DML_1$, $DMR_1$ respectively, where the polarities of the first dummy signals $DSL_1$, $DSR_1$ are respectively opposite to the polarity of the pixel units PX of the first pixel unit column $PC_1$ and the polarity of the pixel units PX of the $M^{th}$ pixel unit column $PC_M$. Therefore, the electric field between the pixel electrodes PE of the pixel units PX of the first pixel unit column $PC_1$ and the common electrode is opposite to the electric field between the first dummy electrode $DML_1$ and the common electrode, and the electric field between the pixel electrodes PE of the pixel units PX of the $M^{th}$ pixel unit column $PC_M$ and the common electrode is opposite to the electric field between the first dummy electrode $DMR_1$ and the common electrode, thereby preventing the accumulation of ions at the edges of the pixel units $PX_1$-$PX_N$ of the first pixel unit column $PC_1$ and the $M^{th}$ pixel unit column $PC_M$ that may affect the display quality of the display device 5.

In this embodiment, the first dummy signal $DSL_1$ and the first dummy signal $DSR_1$ may have different polarities during two adjacent frames (similar to the polarity change of the first dummy signals $DSL_1$, $DSR_1$ in FIG. 5), or the first dummy signal $DSL_1$ and the first dummy signal $DSR_1$ may have multiple switches of positive polarity and negative polarity (similar to the polarity change of the first dummy signals $DSL_1$, $DSR_1$ in FIG. 7) in a single frame, but are not limited thereto. For example, during the data update period in a frame period and/or the blank period (or touch sensing period) in a frame period, the first dummy pads $PDL_1$, $PDR_1$ of the driving circuit 510 can respectively output the first dummy signal $DSL_1$ with multiple switches of positive polarity and negative polarity and the first dummy signal $DSR_1$ with multiple switches of positive polarity and negative polarity to the first dummy electrodes $DML_1$, $DMR_1$, but are not limited thereto. The first dummy signals $DSL_1$, $DSR_1$ in this embodiment can be independent of the first pixel signal $PS_1$ to the $M^{th}$ pixel signal $PS_M$, so this embodiment does not limit the driving mode of the display device 5. For example, the driving mode of the display device 5 may be one of frame inversion, column inversion, row inversion, dot inversion, etc. In addition, in some embodiments, the first dummy signal $DSL_1$ and the first dummy signal $DSR_1$ can be the same as each other, and the first dummy electrodes $DML_1$, $DMR_1$ can be electrically connected to the same dummy pad (for example, the first dummy electrodes $DML_1$, $DMR_1$ are electrically connected to the first dummy pad $PDL_1$, or the first dummy electrodes $DML_1$, $DMR_1$ are electrically connected to the first dummy pad $PDR_1$).

Figure 19:
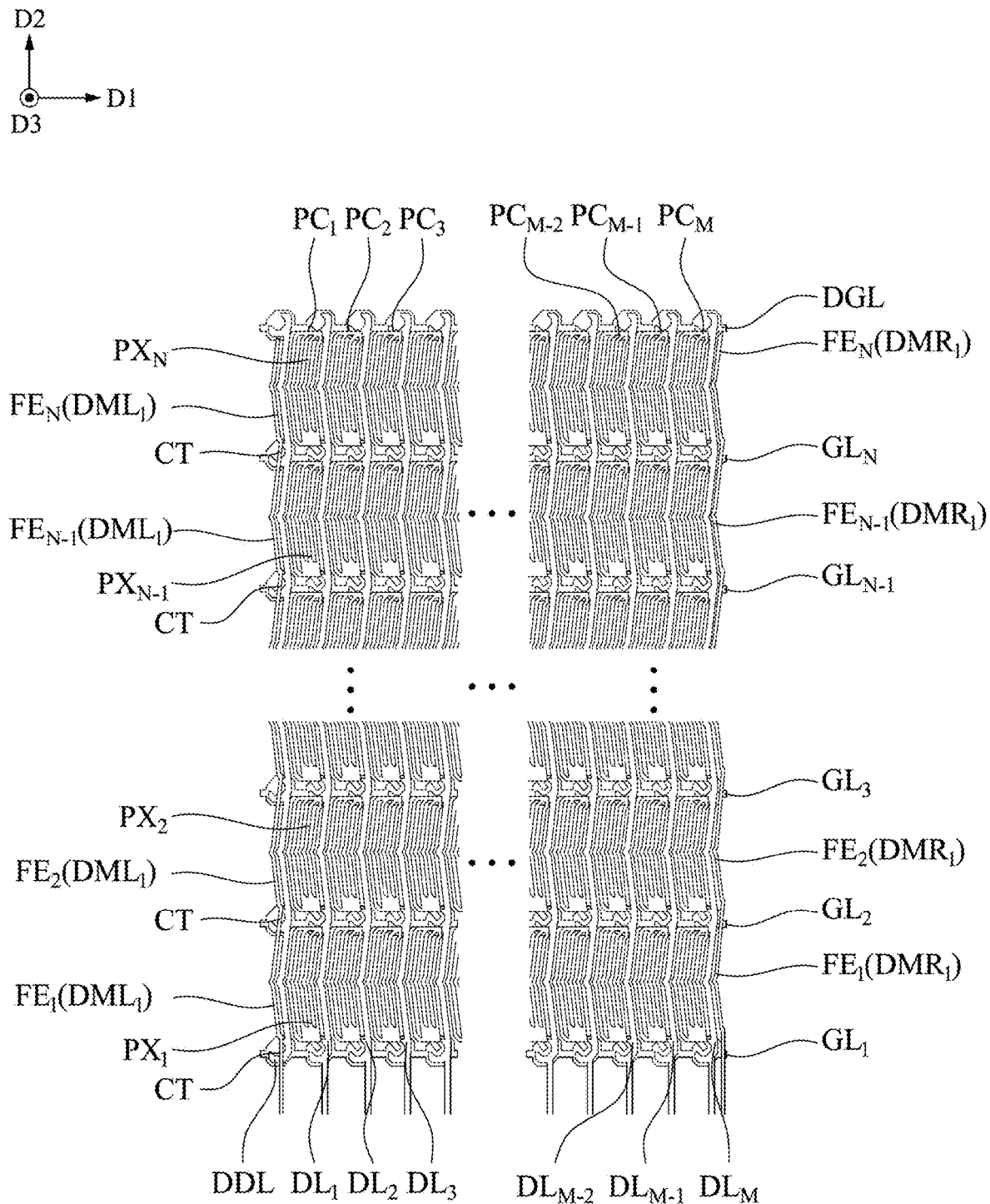
FIG. 19 is a simplified layout diagram of a display device according to the fourth embodiment of the present disclosure.

FIG. 19 is a simplified layout diagram of a display device 5 according to the fourth embodiment of the present disclosure. The structures, the materials, the manufacturing processes and the relative positions of most elements of the embodiments of FIG. 19 and FIG. 8 are the same, so the same features are not repeated here. The main difference between FIG. 19 and FIG. 8 is that each of the first dummy electrodes $DML_1$, $DMR_1$ further includes connection parts CT to electrically connect any two adjacent strip electrodes among the strip electrodes $FE_1$-$FE_N$. Specifically, as shown in FIG. 19, taking the first dummy electrode $DML_1$ as an example, a connection part CT electrically connects the $N^{th}$ strip electrode $FE_N$ and the $(N-1)^{th}$ strip electrode $FE_{N-1}$, and so on, another connection part CT electrically connects the second strip electrode $FE_2$ and the first strip electrode $FE_1$.

Figure 20:
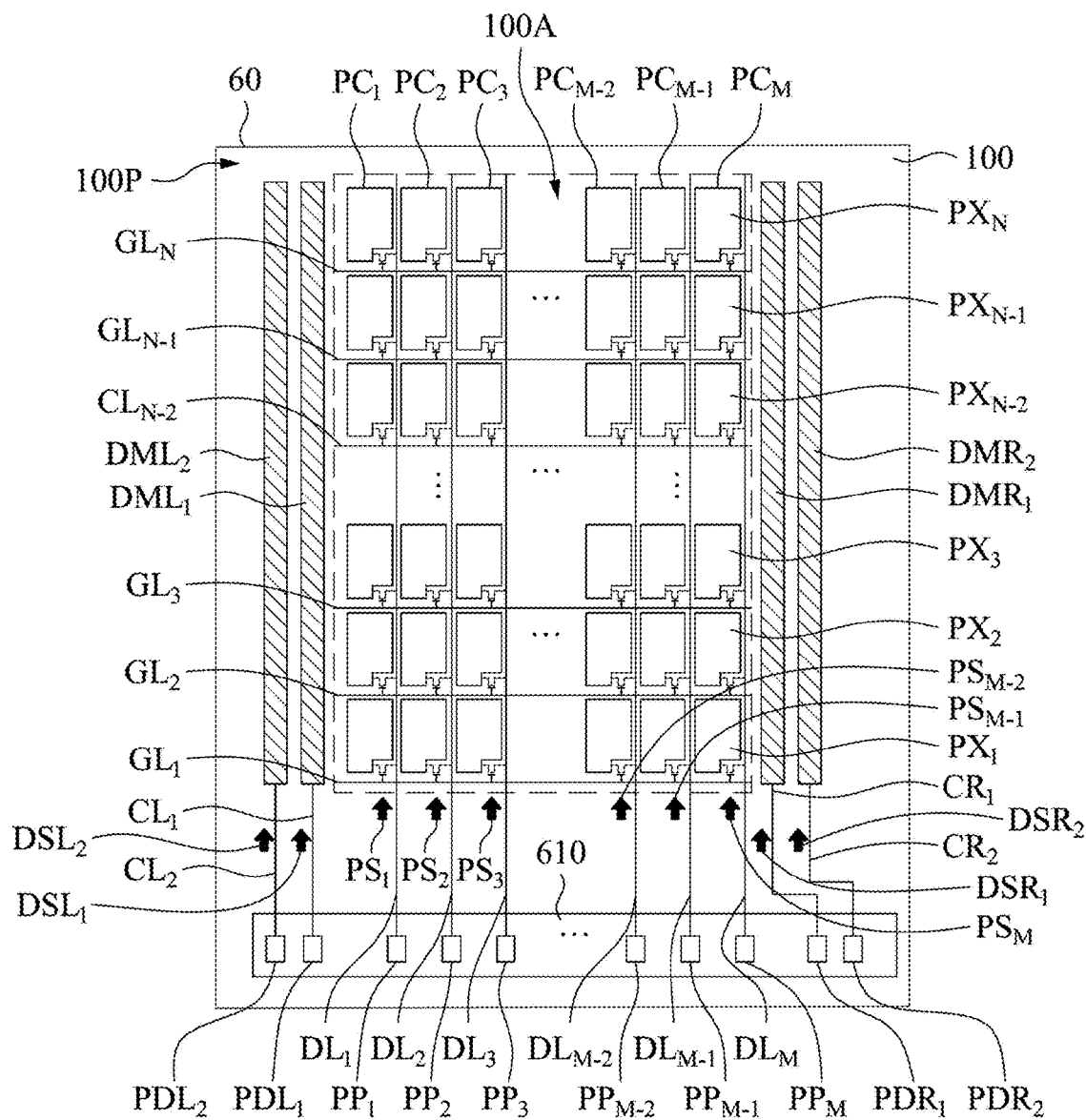
FIG. 20 is a schematic view of a display device according to the fifth embodiment of the present disclosure.

FIG. 20 is a schematic view of a display device 6 according to the fifth embodiment of the present disclosure. The structures, the materials, the manufacturing processes and the relative positions of most elements of the embodiments of FIG. 20 and FIG. 18 are the same, so the same features are not repeated here. As shown in FIG. 20, the dummy electrode group DM of the display device 6 further includes a second dummy electrode $DML_2$, the driving circuit 610 further includes a second dummy pad $PDL_2$, and the second dummy electrode $DML_2$ is electrically connected to the second dummy pad $PDL_2$. In some embodiments, the driving circuit 610 may be disposed in at least one chip, but is not limited thereto. In FIG. 20, the driving circuit 610 is provided on the substrate 100, but is not limited thereto. In other embodiments, the driving circuit 610 may be disposed on a circuit board, and the circuit board is electrically connected to pads disposed on the substrate 100. During a frame period, the driving circuit 610 transmits the second dummy signal $DSL_2$ to the second dummy electrode $DML_2$. In some embodiments, the second dummy electrode $DML_2$ is electrically connected to the second dummy pad $PDL_2$ through the second connection line $CL_2$ of the array substrate 60.

In addition, as shown in FIG. 20, the dummy electrode group DM further includes a second dummy electrode $DMR_2$, the driving circuit 610 further includes a second dummy pad $PDR_2$, and the second dummy electrode $DMR_2$ is electrically connected to the second dummy pad $PDR_2$. During the frame period, the driving circuit 610 further transmits the second dummy signal $DSR_2$ to the second dummy electrode $DMR_2$. In some embodiments, the second dummy electrode $DMR_2$ is electrically connected to the second dummy pad $PDR_2$ through the second connection line $CR_2$.

During a frame period, the driving circuit 610 may transmit the first dummy signals $DSL_1$, $DSR_1$ to the first dummy electrodes $DML_1$, $DMR_1$ respectively, and transmit the second dummy signals $DSL_2$, $DSR_2$ to the second dummy electrodes $DML_2$, $DMR_2$ respectively, where the polarities of the first dummy signals $DSL_1$, $DSR_1$ are respectively opposite to the polarity of the pixel units PX of the first pixel unit column $PC_1$ and the polarity of the pixel units PX of the $M^{th}$ pixel unit column $PC_M$, and the polarities of the second dummy signals $DSL_2$, $DSR_2$ are respectively opposite to the polarities of the first dummy signals $DSL_1$, $DSR_1$. Therefore, the electric field between the pixel electrodes PE of the pixel units PX of the first pixel unit column $PC_1$ and the common electrode is opposite to the electric field between the first dummy electrode $DML_1$ and the common electrode, the electric field between the first dummy electrode $DML_1$ and the common electrode is opposite to the electric field between the second dummy electrode $DML_2$ and the common electrode, the electric field between the pixel electrodes PE of the pixel units PX of the $M^{th}$ pixel unit column $PC_M$ and the common electrode is opposite to the electric field between the first dummy electrode $DMR_1$ and the common electrode, and the electric field between the first dummy electrode $DMR_1$ and the common electrode is opposite to the electric field between the second dummy electrode $DMR_2$ and the common electrode. Compared with the fourth embodiment, the ion accumulation region can be further away from the display area 100A to improve the display quality of the display device 6 in this embodiment.

In this embodiment, the first dummy signals $DSL_1$, $DSR_1$ and the second dummy signals $DSL_2$, $DSR_2$ may have different polarities during two adjacent frames (similar to the polarity change of the first dummy signals $DSL_1$, $DSR_1$ and the polarity change of the second dummy signals $DSL_2$, $DSR_2$ in FIG. 12), or the first dummy signals $DSL_1$, $DSR_1$ and the second dummy signals $DSL_2$, $DSR_2$ may have multiple switches of positive polarity and negative polarity (similar to the polarity change of the first dummy signals $DSL_1$, $DSR_1$ and the polarity change of the second dummy signals $DSL_2$, $DSR_2$ in FIG. 14) in a single frame, but are not limited thereto. The first dummy signals $DSL_1$, $DSR_1$ and the second dummy signals $DSL_2$, $DSR_2$ in this embodiment can be independent of the first pixel signal $PS_1$ to the $M^{th}$ pixel signal $PS_M$, so this embodiment does not limit the driving mode of the display device 6. For example, the driving mode of the display device 6 may be one of frame inversion, column inversion, row inversion, dot inversion, etc. In addition, in some embodiments, the first dummy signal $DSL_1$ and the first dummy signal $DSR_1$ can be the same as each other, and/or the second dummy signal $DSL_2$ and the second dummy signal $DSR_2$ can be the same as each other. Therefore, the first dummy electrodes $DML_1$, $DMR_1$ can be electrically connected to the same dummy pad (for example, the first dummy electrodes $DML_1$, $DMR_1$ are electrically connected to the first dummy pad $PDL_1$, or the first dummy electrodes $DML_1$, $DMR_1$ are electrically connected to the first dummy pad $PDR_1$) and/or the second dummy electrodes $DML_2$, $DMR_2$ can be electrically connected to the same dummy pad (for example, the second dummy electrodes $DML_2$, $DMR_2$ are electrically connected to the second dummy pad $PDL_2$, or the second dummy electrodes $DML_2$, $DMR_2$ are electrically connected to the second dummy pad $PDR_2$).

Figure 21:
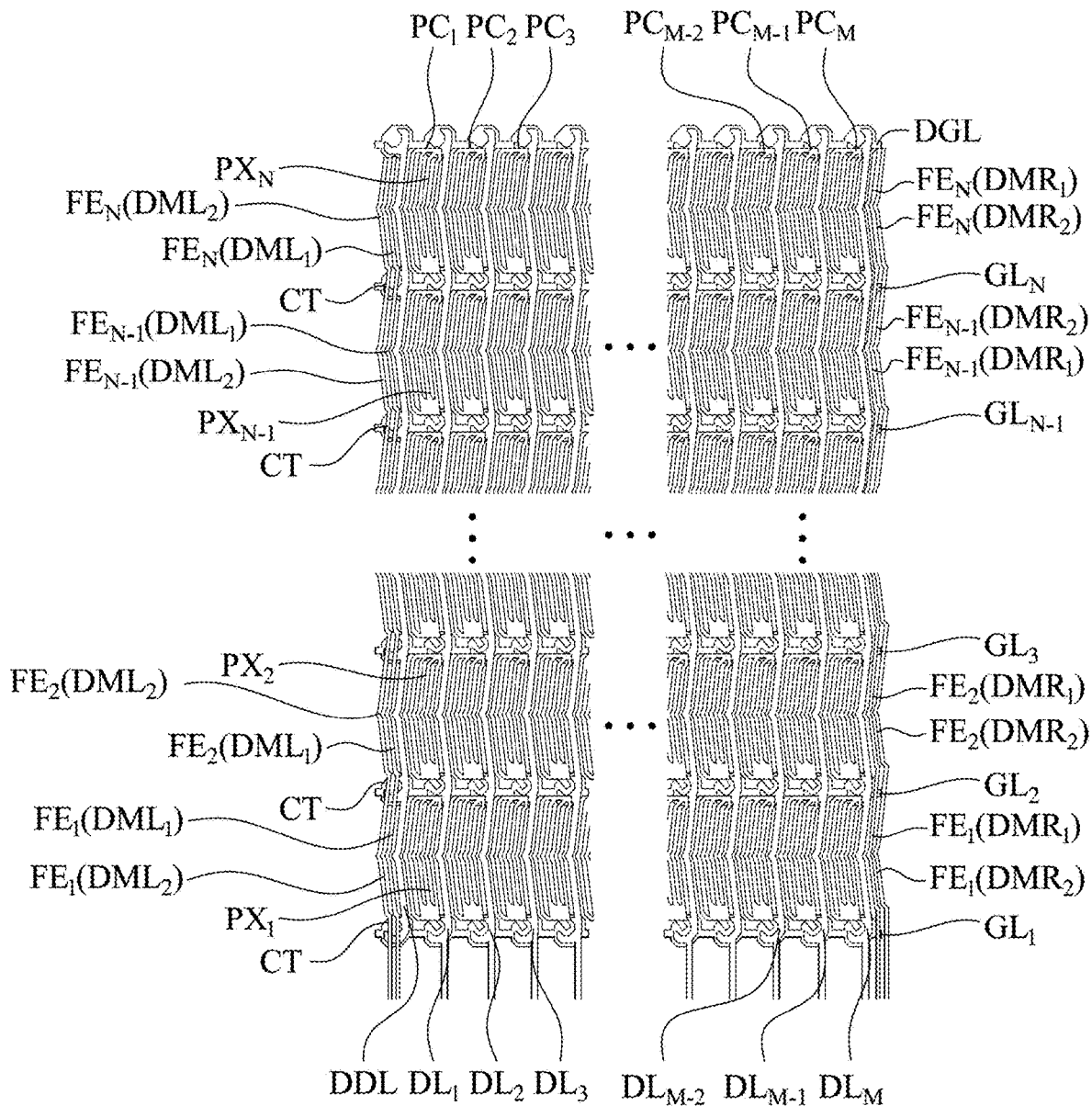
FIG. 21 is a simplified layout diagram of a display device according to the fifth embodiment of the present disclosure.

FIG. 21 is a simplified layout diagram of a display device 6 according to the fourth embodiment of the present disclosure. The structures, the materials, the manufacturing processes and the relative positions of most elements of the embodiments of FIG. 21 and FIG. 15 are the same, so the same features are not repeated here. The main difference between FIG. 21 and FIG. 15 is that each of the first dummy electrodes $DML_1$, $DMR_1$ and the second dummy electrodes $DML_2$, $DMR_2$ further includes connection parts CT to electrically connect any two adjacent strip electrodes among the strip electrodes $FE_1$-$FE_N$.

Specifically, as shown in FIG. 21, taking the second dummy electrode $DML_2$ as an example, a connection part CT electrically connects the $N^{th}$ strip electrode $FE_N$ and the $(N-1)^{th}$ strip electrode $FE_{N-1}$, and so on, another connection part CT electrically connects the second strip electrode $FE_2$ and the first strip electrode $FE_1$.

As can be seen from the above-mentioned first to fifth embodiments, m number of dummy electrodes may be disposed on one side of the first pixel unit column $PC_1$ (i.e., the opposite side of the first pixel unit column $PC_1$ to the second pixel unit column $PC_2$) and another m number of dummy electrodes may be disposed on one side of the $M^{th}$ pixel unit column $PC_M$ (i.e., the opposite side of the $M^{th}$ pixel unit column $PC_M$ to the $(M-1)^{th}$ pixel unit column $PC_{M-1}$) respectively, where m is a positive integer greater than or equal to 1, and m is less than or equal to the number of the strip parts F of the pixel electrode PE in one pixel unit PX. For example, when the pixel electrode PE of a pixel unit PX of the display device has four strip parts F (as shown in FIG. 9A), then at least one to at most four dummy electrodes can be disposed on one side of any one of the first pixel unit column $PC_1$ and the $M^{th}$ pixel unit column $PC_M$. During a frame, the polarities of the first pixel unit column $PC_1$ and the first dummy electrode $DML_1$ adjacent to the first pixel unit column $PC_1$ are opposite to each other and the polarities of the $M^{th}$ pixel unit column $PC_M$ and the first dummy electrode $DMR_1$ adjacent to the $M^{th}$ pixel unit column $PC_M$ are opposite to each other, so as to prevent ions from accumulating at the sides of the first pixel unit column $PC_1$ and the $M^{th}$ pixel unit column $PC_M$ to form a color shift phenomenon at the edge of the display area 100A. In addition, when the number of dummy electrodes is greater and the polarities of two adjacent dummy electrodes are opposite to each other during a frame period, the ion accumulation region is further away from the display area 100A, so the reliability of the display device can be further improved. In the first to third embodiments, the dummy electrodes can be electrically connected to the data lines so that the polarities of the pixel unit columns and the dummy electrodes adjacent to the pixel unit columns are opposite to each other and the polarities of two adjacent dummy electrodes are opposite to each other. In the fourth and fifth embodiments, the dummy electrodes can be electrically connected to the dummy pads of the driving circuit, and the driving circuit provides dummy signals to the dummy electrodes so that the polarities of the pixel unit columns and the dummy electrodes adjacent to the pixel unit columns are opposite to each other and the polarities of two adjacent dummy electrodes are opposite to each other.

In summary, the present disclosure mitigate the phenomenon of residual ions and thereby effectively avoid color shift by disposing dummy electrodes in the peripheral area, where signal polarities of the dummy electrodes are different from the signal polarities of the pixel unit columns adjacent to the dummy electrodes.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A display device, having a display area and a peripheral area, and comprising:
    an array substrate, comprising:
        a substrate;
        M number of pixel unit columns, disposed on the substrate and located in the display area, wherein M is a positive integer greater than or equal to 2, the M number of pixel unit columns comprises a first pixel unit column to an $M^{th}$ pixel unit column sequentially arranged in a first direction, and each of the M number of pixel unit columns comprises a plurality of pixel units sequentially arranged in a second direction different from the first direction, wherein each of the pixel units comprises a pixel electrode and a common electrode located between the pixel electrode and the substrate in a direction perpendicular to the substrate, the pixel electrode comprises a plurality of strip parts and at least one slit, and each slit is located between two adjacent strip parts of the strip parts; and
        a first dummy electrode and another first dummy electrode, disposed on the substrate and located in the peripheral area, wherein the display area has a first side and a second side that are opposite to each other in the first direction, the first pixel unit column and the $M^{th}$ pixel unit column are the pixel unit columns closest to the first side and the second side respectively, the first dummy electrode is located on a side of adjacent to the first side, and the another first dummy electrode is located adjacent to the second side; and
        M number of data lines, disposed on the substrate and located in the display area, wherein the M number of data lines comprises a first data line to an $M^{th}$ data line respectively electrically connected to the first pixel unit column to the $M^{th}$ pixel unit column, the first dummy electrode is electrically connected to an $i^{th}$ data line among the first data line to the $M^{th}$ data line, i is an even number greater than 1 and less than or equal to M, the another first dummy electrode is electrically connected to an $(M-j)^{th}$ data line among the first data line to the $M^{th}$ data line, and i is an odd number greater than or equal to 1 and less than M;
    wherein during a frame period, the first pixel unit column receives a first pixel signal, the $i^{th}$ pixel unit column and the first dummy electrode receive an $i^{th}$ pixel signal, the $(M-j)^{th}$ pixel unit column and the another first dummy electrode receive an $(M-j)^{th}$ pixel signal, the $M^{th}$ pixel unit column receives an $M^{th}$ pixel signal, a polarity of the first pixel signal is different from a polarity of the $i^{th}$ pixel signal, and a polarity of the $M^{th}$ pixel signal is different from a polarity of the $(M-j)^{th}$ pixel signal.

2. The display device of claim 1, wherein a driving mode of the display device is column inversion driving or dot inversion driving.

3. The display device of claim 1, wherein the array substrate further comprises a second dummy electrode disposed on the substrate and located in the peripheral area, the second dummy electrode is located on a side of the first dummy electrode, the first dummy electrode is between the second dummy electrode and the first pixel unit column, wherein during the frame period, the second dummy electrode receives a second dummy signal, and a polarity of the second dummy signal is different from the polarity of the $i^{th}$ pixel signal.

4. The display device of claim 3, wherein a driving mode of the display device is column inversion driving or dot inversion driving, the second dummy electrode is electrically connected to a $p^{th}$ data line among the first data line to the $M^{th}$ data line, p is an odd number greater than or equal to 1 and less than or equal to M.

5. The display device of claim 1, wherein the array substrate further comprises another second dummy electrode disposed on the substrate and located in the peripheral area, the another second dummy electrode is located on a side of the another first dummy electrode, the another first dummy electrode is between the another second dummy electrode and the MU pixel unit column, wherein during the frame period, the another second dummy electrode receives another second dummy signal, and a polarity of the another second dummy signal is different from the polarity of the $(M-j)^{th}$ pixel signal.

6. The display device of claim 5, wherein a driving mode of the display device is column inversion driving or dot inversion driving, the another second dummy electrode is electrically connected to an $(M-q)^{th}$ data line among the first data line to the $M^{th}$ data line, q is 0 or an even number greater than 1 and less than M.

7. The display device of claim 1, wherein the first pixel unit column comprises N number of pixel units, N is a positive integer greater than or equal to 2, the N number of pixel units comprise a first pixel unit to an $N^{th}$ pixel unit, and the first dummy electrode comprises N number of strip electrodes, the N number of strip electrodes comprise a first strip electrode to an $N^{th}$ strip electrode electrically connected to each other, wherein the first strip electrode to the $N^{th}$ strip electrode are respectively adjacent to the first pixel unit to the $N^{th}$ pixel unit.

8. The display device of claim 7, wherein the first strip electrode to the $N^{th}$ strip electrode and the pixel electrode of the first pixel unit to the pixel electrode of the $N^{th}$ pixel unit are a same transparent conductive layer.

9. The display device of claim 7, wherein shapes of the first strip electrode to the $N^{th}$ strip electrode are the same as shapes of the strip parts of the pixel electrodes of the first pixel unit to the $N^{th}$ pixel unit in a top view.

10. The display device of claim 1, wherein the array substrate comprises K number of dummy electrodes located on a side of the first pixel unit column, K is a positive integer greater than or equal to 2 and less than or equal to a number of the strip parts of the pixel electrode of one of the pixel units, the K number of dummy electrodes comprises the first dummy electrode to an $K^{th}$ dummy electrode, and the first dummy electrode to the $K^{th}$ dummy electrode are sequentially arranged in a direction opposite to the first direction, wherein during the frame period, polarities of any two adjacent dummy electrodes among the first dummy electrode to the $K^{th}$ dummy electrode are opposite to each other.

* * * * *